US010483383B2

(12) United States Patent
Weyers et al.

(10) Patent No.: US 10,483,383 B2
(45) Date of Patent: Nov. 19, 2019

(54) SEMICONDUCTOR DEVICE INCLUDING A GATE CONTACT STRUCTURE

(71) Applicant: Infineon Technologies Dresden GmbH & Co. KG, Dresden (DE)

(72) Inventors: Joachim Weyers, Hoehenkirchen (DE); Katarzyna Kowalik-Seidl, Unterhaching (DE); Andreas Schloegl, Ottobrunn (DE); Enrique Vecino Vazquez, Munich (DE)

(73) Assignee: Infineon Technologies Dresden GmbH & Co. KG, Dresden (DE)

( * ) Notice: Subject to any disclaimer, the term of this patent is extended or adjusted under 35 U.S.C. 154(b) by 0 days.

(21) Appl. No.: 15/921,044

(22) Filed: Mar. 14, 2018

(65) Prior Publication Data
US 2018/0269296 A1 Sep. 20, 2018

(30) Foreign Application Priority Data

Mar. 15, 2017 (DE) ......................... 10 2017 105 548

(51) Int. Cl.
*H01L 29/73* (2006.01)
*H01L 29/06* (2006.01)
(Continued)

(52) U.S. Cl.
CPC ...... *H01L 29/7304* (2013.01); *H01L 27/0635* (2013.01); *H01L 29/0696* (2013.01);
(Continued)

(58) Field of Classification Search
CPC ............. H01L 29/0696; H01L 29/1095; H01L 29/66325; H01L 29/66333; H01L 29/6634; H01L 29/66348; H01L 29/7302; H01L 29/7304; H01L 29/7393; H01L 29/7395; H01L 29/7396; H01L 29/7397; H01L 27/0288; H01L 27/0629; H01L 27/0635; H01L 27/0647; H01L 27/0652;
(Continued)

(56) References Cited

U.S. PATENT DOCUMENTS 5,592,006 A * 1/1997 Merrill .................. H01L 29/435
257/140
2002/0175705 A1 11/2002 Lowy et al.
(Continued)

FOREIGN PATENT DOCUMENTS

DE 19512799 A1 10/1996
DE 19823069 A1 4/1999
(Continued)

*Primary Examiner* — Eduardo A Rodela
(74) *Attorney, Agent, or Firm* — Murphy, Bilak & Homiller, PLLC

(57) ABSTRACT

A semiconductor device includes a semiconductor body. The semiconductor body has a first surface and a second surface opposite to the first surface. A transistor cell structure is provided in the semiconductor body. A gate contact structure includes a gate line electrically coupled to a gate electrode layer of the transistor cell structure, and a gate pad electrically coupled to the gate line. A gate resistor structure is electrically coupled between the gate pad and the gate electrode layer. An electric resistivity of the gate resistor structure is greater than the electric resistivity of the gate electrode layer.

20 Claims, 16 Drawing Sheets

(51) Int. Cl.

| | |
|---|---|
| *H01L 27/06* | (2006.01) |
| *H01L 29/40* | (2006.01) |
| *H01L 29/43* | (2006.01) |
| *H01L 29/78* | (2006.01) |
| *H01L 29/423* | (2006.01) |
| *H01L 29/66* | (2006.01) |
| *H01L 29/739* | (2006.01) |
| *H01L 49/02* | (2006.01) |
| *H01L 29/10* | (2006.01) |

(52) U.S. Cl.
CPC ........ *H01L 29/401* (2013.01); *H01L 29/4238* (2013.01); *H01L 29/435* (2013.01); *H01L 29/6634* (2013.01); *H01L 29/7302* (2013.01); *H01L 29/7396* (2013.01); *H01L 29/7801* (2013.01); *H01L 27/0629* (2013.01); *H01L 28/20* (2013.01); *H01L 29/1095* (2013.01); *H01L 29/404* (2013.01); *H01L 29/66348* (2013.01); *H01L 29/7397* (2013.01); *H01L 29/7398* (2013.01)

(58) Field of Classification Search
CPC ............. H01L 27/0658; H01L 27/0676; H01L 27/0711; H01L 27/0727; H01L 27/0738; H01L 27/075; H01L 27/0755; H01L 27/0772; H01L 27/0788; H01L 28/00; H01L 28/20; H01L 2924/1207; H01L 2924/19043

See application file for complete search history.

(56) References Cited

U.S. PATENT DOCUMENTS

| | | | |
|---|---|---|---|
| 2011/0318897 A1* | 12/2011 | Shang ............... | H01L 21/76229 438/382 |
| 2012/0098071 A1* | 4/2012 | Aggarwal ........... | H01L 27/0629 257/369 |
| 2012/0126315 A1 | 5/2012 | Onishi et al. | |
| 2013/0249602 A1* | 9/2013 | Mauder ............... | H01L 29/7801 327/108 |
| 2015/0042177 A1* | 2/2015 | Weyers ............... | H01L 29/7397 307/115 |
| 2015/0043116 A1* | 2/2015 | Weyers ............... | H01L 27/0255 361/91.5 |
| 2015/0333168 A1* | 11/2015 | Hirler ................. | H01L 29/0615 257/329 |
| 2015/0333169 A1* | 11/2015 | Willmeroth ......... | H01L 29/7809 257/329 |
| 2016/0141204 A1* | 5/2016 | Kawahara ......... | H01L 21/76224 257/330 |
| 2017/0019096 A1 | 1/2017 | Vecino Vazquez et al. | |
| 2017/0110545 A1* | 4/2017 | Nagao ..................... | H01L 29/47 |
| 2018/0090479 A1* | 3/2018 | Weyers ............... | H01L 27/0255 |
| 2018/0182750 A1* | 6/2018 | Burke ................. | H01L 27/0629 |
| 2018/0301537 A1* | 10/2018 | Weyers ............... | H01L 27/0255 |
| 2018/0301553 A1* | 10/2018 | Weyers ................ | H01L 29/861 |
| 2018/0321094 A1* | 11/2018 | Jang ........................ | G01K 7/015 |

FOREIGN PATENT DOCUMENTS

| | | |
|---|---|---|
| DE | 202004021424 U1 | 2/2008 |
| DE | 112010003113 T5 | 9/2012 |

* cited by examiner

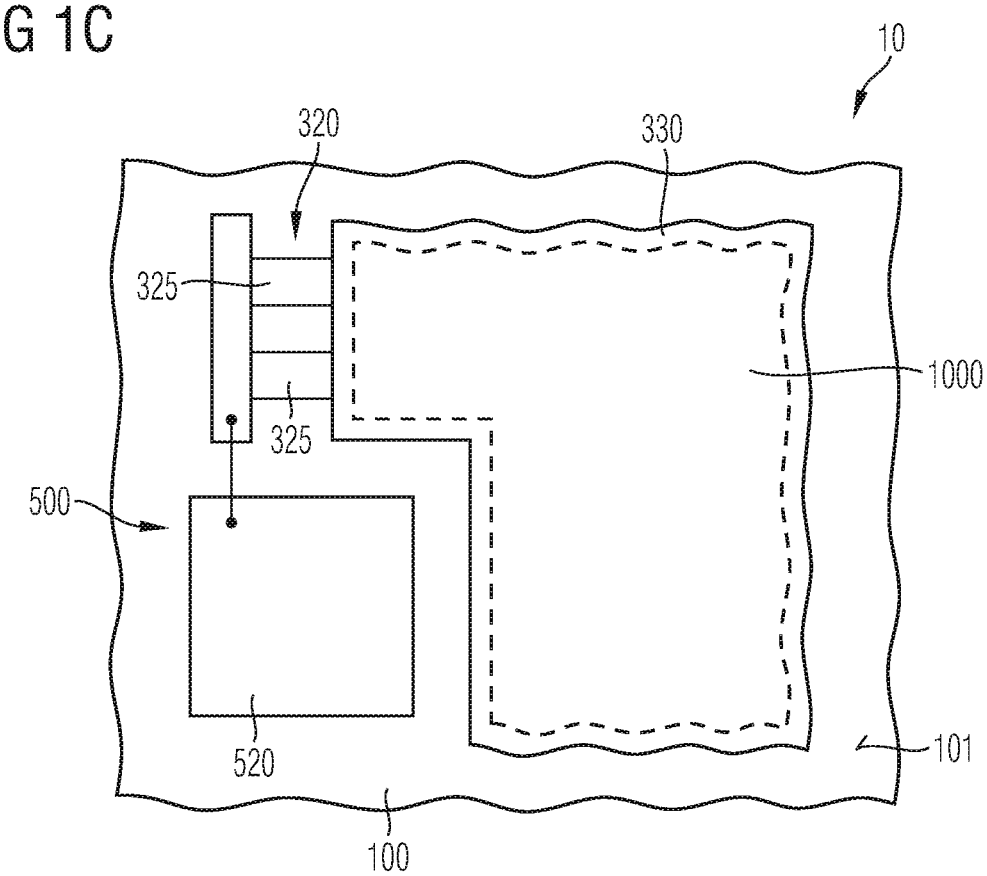

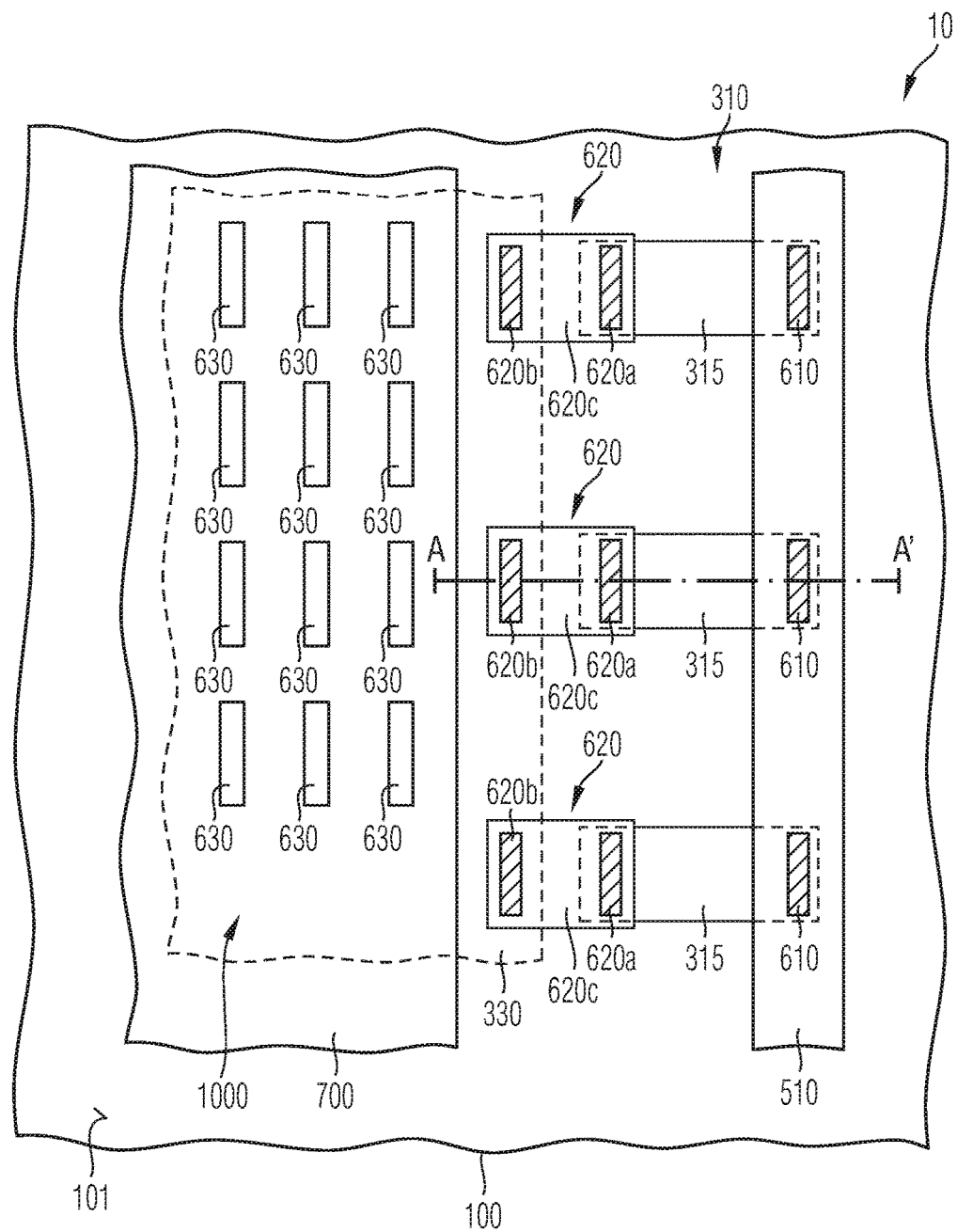

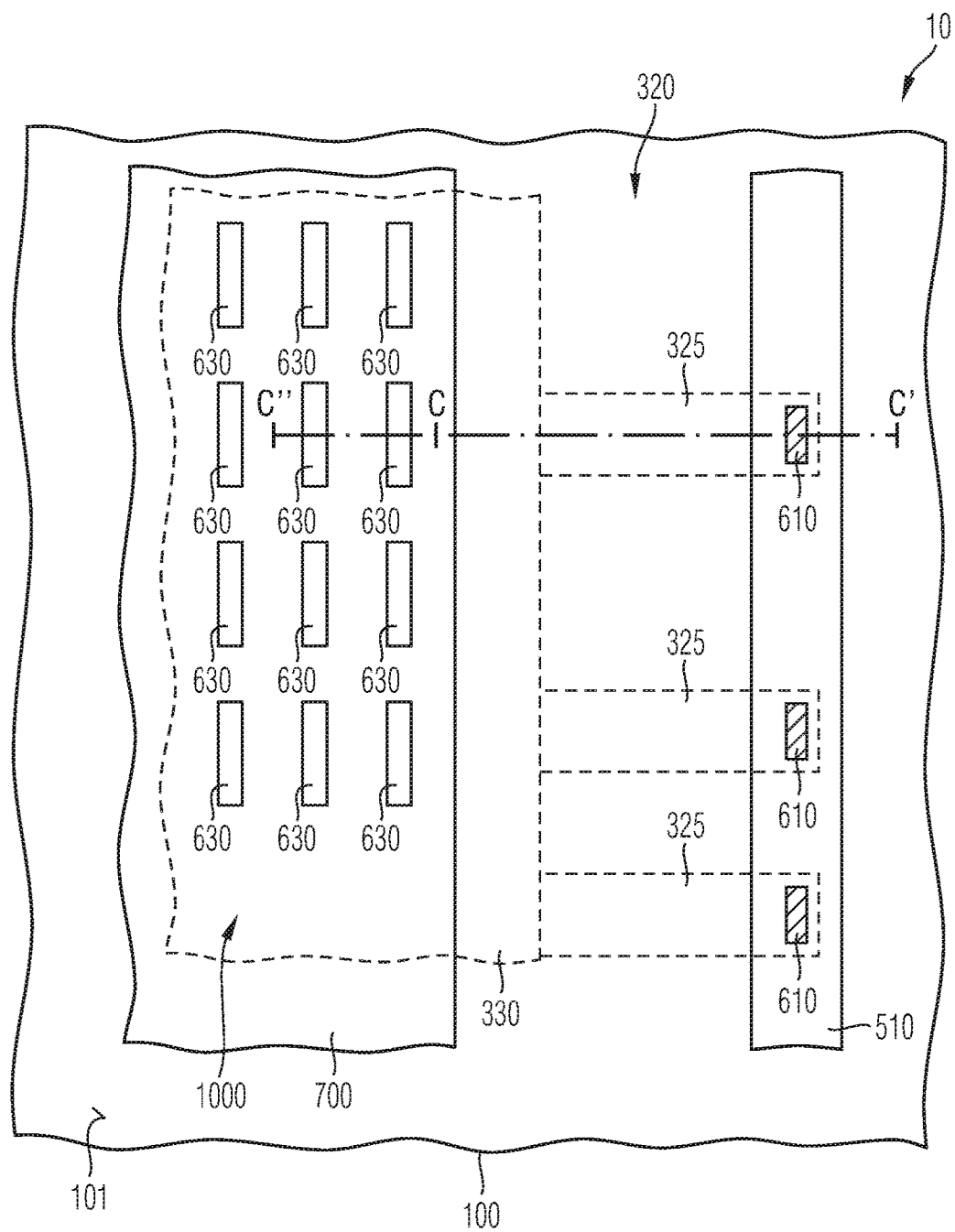

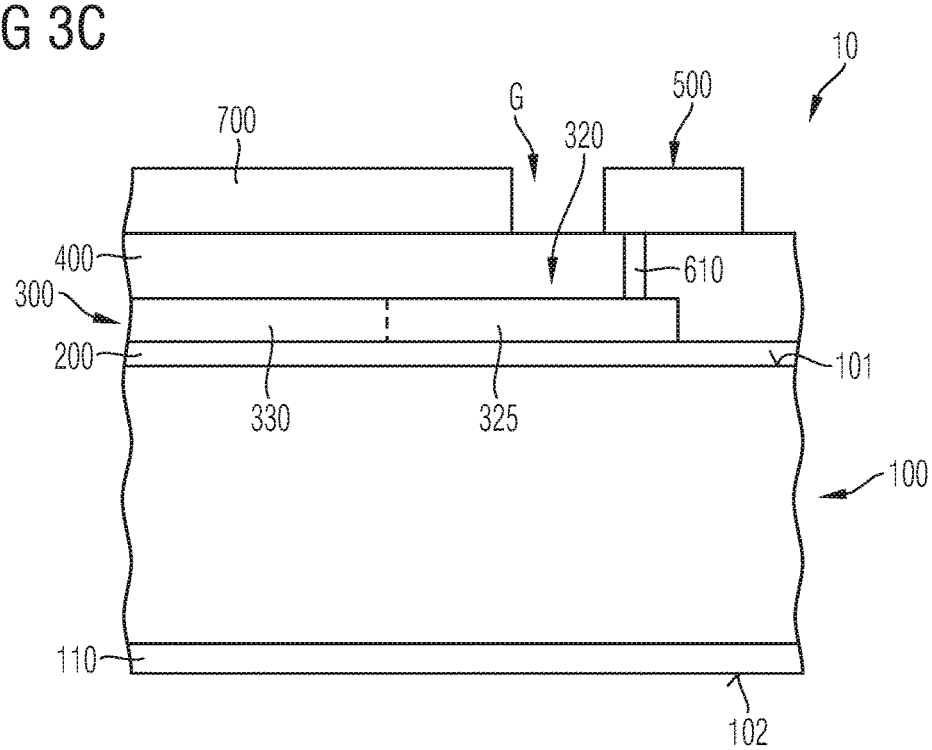
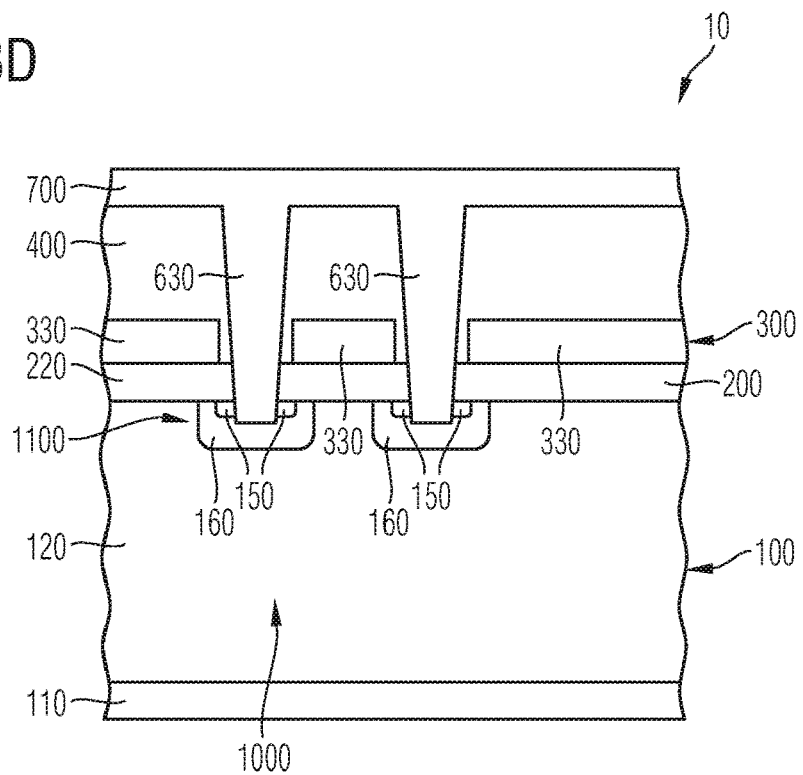

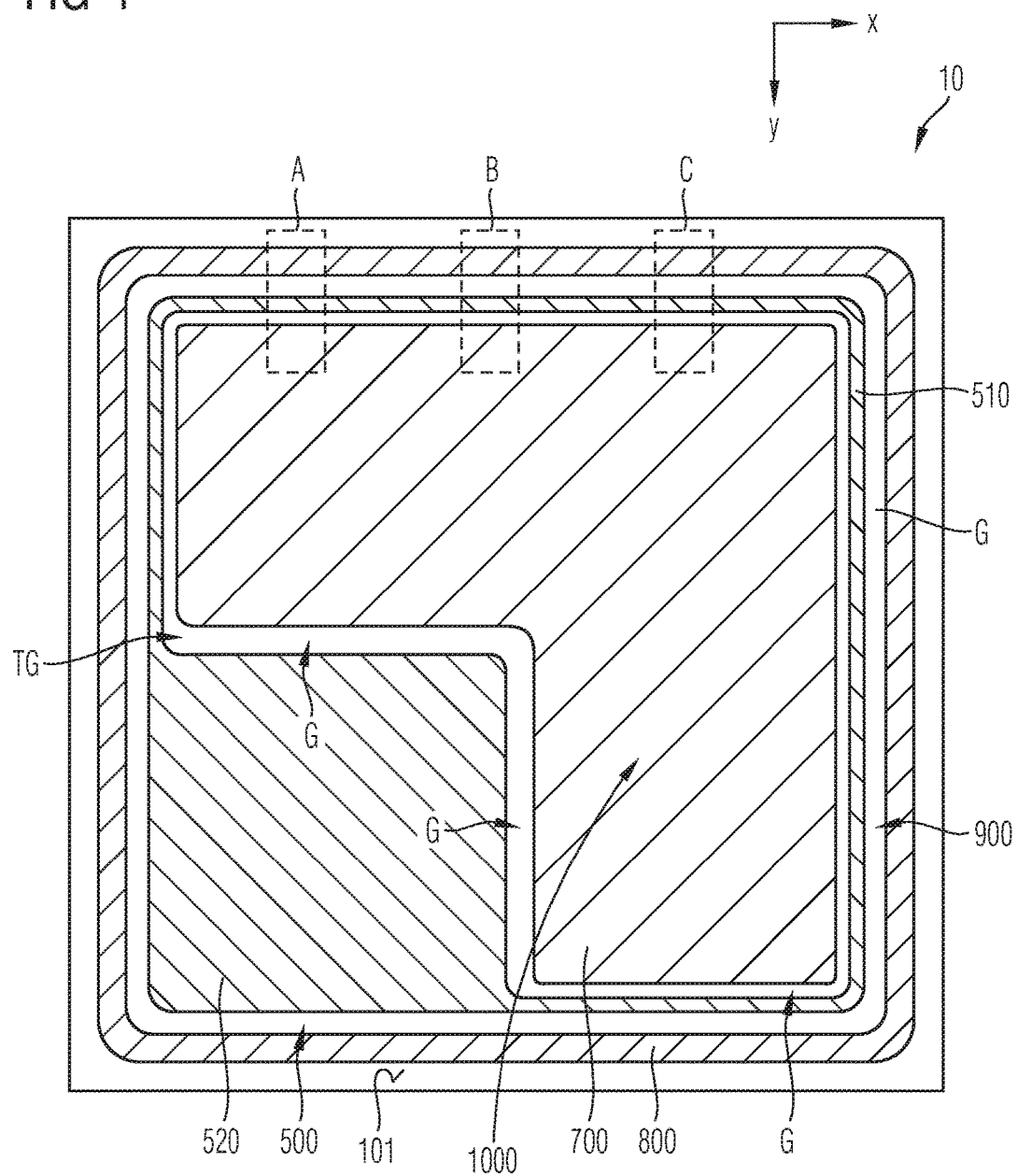

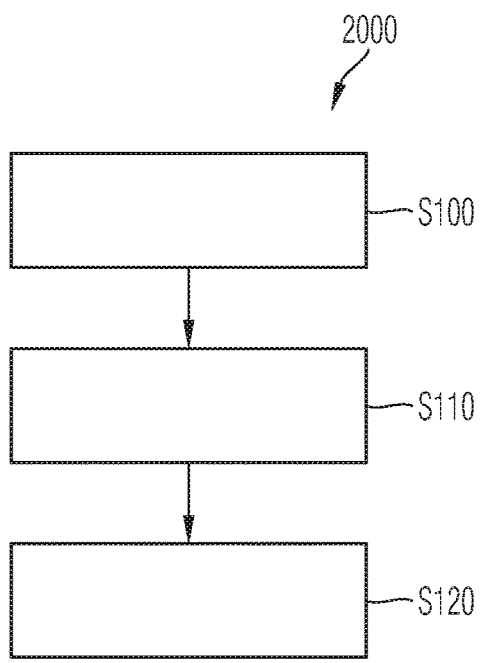
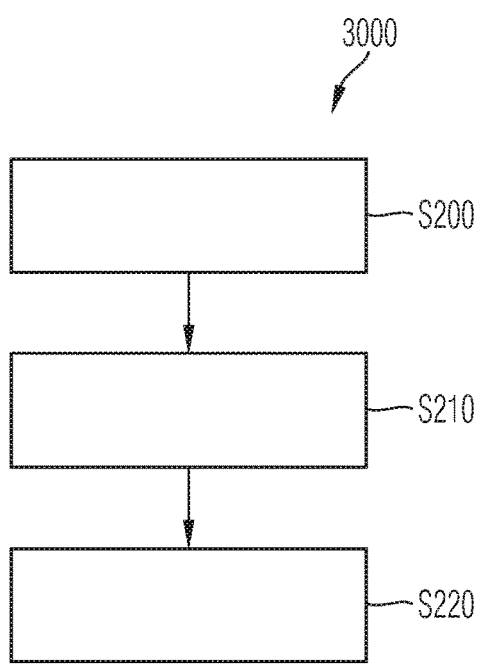

SEMICONDUCTOR DEVICE INCLUDING A GATE CONTACT STRUCTURE

BACKGROUND

A key component in semiconductor applications is a solid-state switch. As an example, switches turn loads of automotive applications or industrial applications on and off. Solid-state switches typically comprise, for example, field effect transistors (FETs) such as metal-oxide-semiconductor FETs (MOSFETs) or insulated gate bipolar transistors (IGBTs).

Inhomogeneous switching may particularly occur for short-duration or short switching processes where predominantly those switchable cells close to gate signal emitters, e.g. close to gate metallization structures are switched. For example, a parasitic current at a gate of a switchable cell resulting from a fast change of a drain-to-source voltage may generate a short-duration voltage increase at the gate. This increase may cause a local re-turn-on of the affected cells.

It is therefore desirable to provide a semiconductor device structure with improved switching behavior.

SUMMARY

The present disclosure relates to a semiconductor device comprising a semiconductor body. The semiconductor body has a first surface and a second surface opposite to the first surface. A transistor cell structure is in the semiconductor body. A gate contact structure comprises a gate line electrically coupled to a gate electrode layer of the transistor cell structure, and a gate pad electrically coupled to the gate line. A gate resistor structure is electrically coupled between the gate pad and the gate electrode layer. An electric resistivity of the gate resistor structure is greater than the electric resistivity of the gate electrode layer.

The present disclosure also relates to another semiconductor device comprising a semiconductor body. The semiconductor body has a first surface and a second surface opposite to the first surface. A transistor cell structure is in the semiconductor body. A gate contact structure comprises a gate line electrically coupled to a gate electrode layer of the transistor cell structure, and a gate pad electrically coupled to the gate line. A gate interconnecting structure comprises gate interconnecting elements. The gate interconnecting elements protrude from the gate electrode layer and are electrically coupled in parallel to the gate line. The minimum resistance of the gate interconnecting elements is greater than 40Ω.

The present disclosure further relates to a method for manufacturing a semiconductor device. The method comprises forming a transistor cell structure in a semiconductor body having a first surface and a second surface opposite to the first surface. A gate contact structure is formed comprising a gate line electrically coupled to a gate electrode layer of the transistor cell structure, and a gate pad electrically coupled to the gate line. A gate resistor structure is formed and electrically coupled between the gate pad and the gate electrode layer. An electric resistivity of the gate resistor structure is greater than the electric resistivity of the gate electrode layer.

The present disclosure further relates to another method for manufacturing a semiconductor device. The method comprises forming a transistor cell structure in the semiconductor body having a first surface and a second surface opposite to the first surface. A gate contact structure is formed comprising a gate line electrically coupled to a gate electrode layer of the transistor cell structure, and a gate pad electrically coupled to the gate line. A gate interconnecting structure is formed comprising gate interconnecting elements protruding from the gate electrode layer and electrically coupled in parallel to the gate line. The minimum resistance of the gate interconnecting elements is greater than 40Ω.

Those skilled in the art will recognize additional features and advantages upon reading the following detailed description and on viewing the accompanying drawings.

BRIEF DESCRIPTION OF THE DRAWINGS

The accompanying drawings are included to provide a further understanding of the invention and are incorporated in and constitute a part of this specification. The drawings illustrate the embodiments of the present invention and together with the description serve to explain principles of the invention. Other embodiments of the invention and intended advantages will be readily appreciated as they become better understood by reference to the following detailed description.

FIGS. 1A to 1C are schematic views illustrating a portion of a semiconductor device in accordance with some embodiments.

FIGS. 2A to 2C are schematic plan views illustrating a portion of a semiconductor device in accordance with some more embodiments.

FIG. 3C is a schematic cross-sectional view of a portion of a semiconductor device taken along the section plane C-C' of FIG. 2C.

FIG. 3D is a schematic cross-sectional view for illustrating a portion of a semiconductor device taken along the section plane C-C" of FIG. 2C.

FIG. 4 is a schematic plan view for illustrating a portion of a semiconductor device in accordance with one more embodiment.

FIGS. 8A and 8B are schematic flow charts for illustrating methods of manufacturing a semiconductor device in accordance with some embodiments.

DETAILED DESCRIPTION

In the following detailed description, reference is made to the accompanying drawings, which form a part hereof, and in which are shown by way of illustrations specific embodiments. It is to be understood that other embodiments may be utilized and structural or logical changes may be made without departing from the scope of the present invention. For example, features illustrated or described for one embodiment can be used on or in conjunction with other embodiments to yield yet a further embodiment. It is intended that the present invention includes such modifications and variations. The examples are described using specific language which should not be construed as limiting the scope of the appending claims. The drawings are not scaled and are for illustrative purposes only. For clarity, the same elements have been designated by corresponding references in the different drawings if not stated otherwise.

The terms "having", "containing", "including", "comprising" and the like are open and the terms indicate the presence of stated structures, elements or features but not preclude additional elements or features. The articles "a", "an" and "the" are intended to include the plural as well as the singular, unless the context clearly indicates otherwise.

The term "electrically connected" describes a permanent low-ohmic connection between electrically connected elements, for example a direct contact between the concerned elements or a low-ohmic connection via a metal and/or highly doped semiconductor. The term "electrically coupled" includes that one or more intervening element(s) configured for signal transmission may be provided between the electrically coupled elements, for example resistors, resistive elements or elements that are controllable to temporarily provide a low-ohmic connection in a first state and a high-ohmic electric decoupling in a second state.

The Figures illustrate relative doping concentrations by indicating "−" or "+" next to the doping type "n" or "p". For example, "n⁻" means a doping concentration that is lower than the doping concentration of an "n"-doping region while an "n⁺"-doping region has a higher doping concentration than an "n"-doping region. Doping regions of the same relative doping concentration do not necessarily have the same absolute doping concentration. For example, two different "n"-doping regions may have the same or different absolute doping concentrations.

Figure 1A:
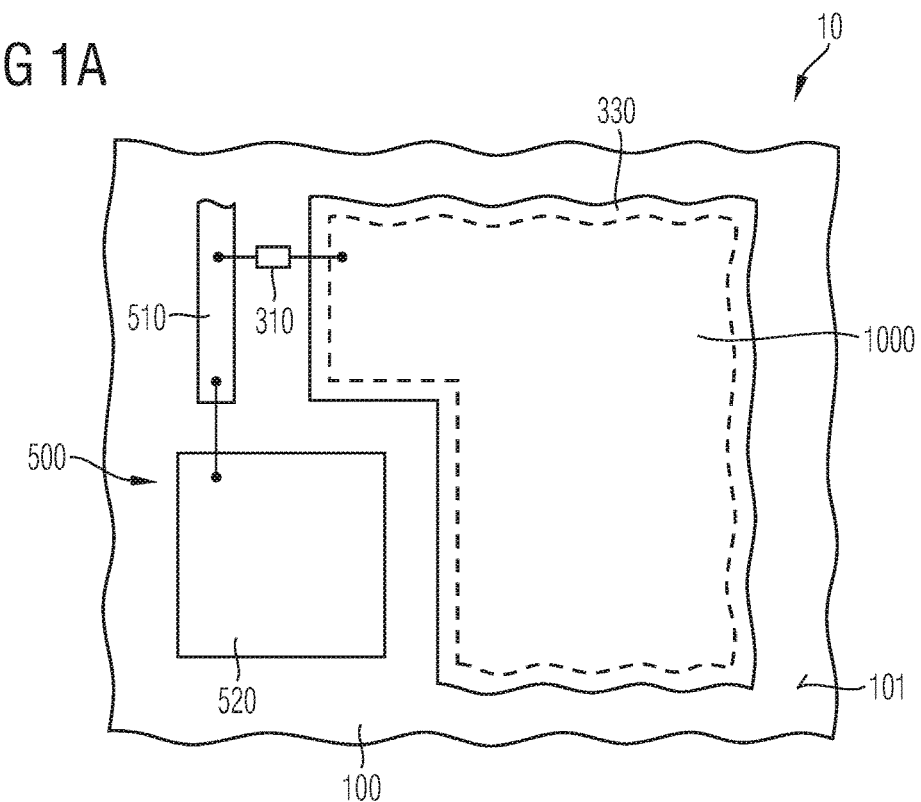
Figure 1B:
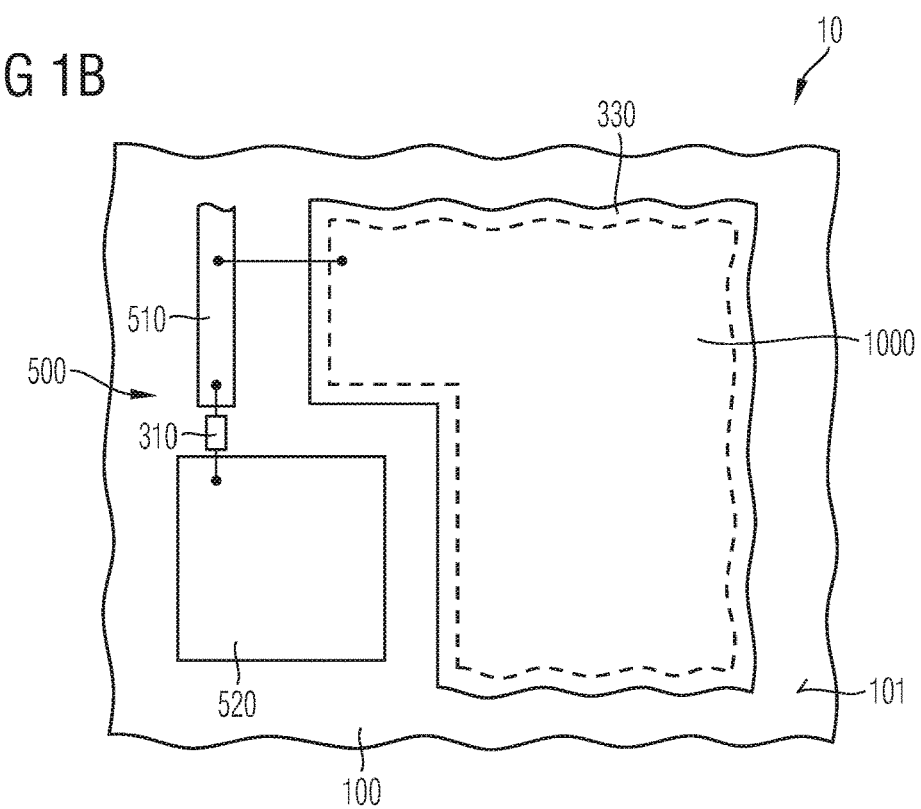

FIGS. 1A and 1B are schematic views for illustrating a portion of a semiconductor device in accordance with some embodiments.

As can be seen from FIG. 1A or 1B, a semiconductor device 10 comprises a semiconductor body 100 having a first surface 101 and a second surface 102 opposite to the first surface 101. A transistor cell structure 1000 is provided in the semiconductor body 100. The semiconductor device 10 further comprises a gate contact structure 500. The gate contact structure 500 comprises a gate line 510 electrically coupled to a gate electrode layer 330 of the transistor cell structure 1000, and a gate pad 520 electrically coupled to the gate line 510. A gate resistor structure 310 is electrically coupled between the gate pad 520 and the gate electrode layer 330, wherein an electric resistivity of the gate resistor structure 310 is greater than the electric resistivity of the gate electrode layer 330. The term "electric resistivity" is to be understood as the specific resistance of the gate resistor structure 310 or the gate electrode layer 330, wherein in the case of providing the gate resistor structure 310 and the gate electrode layer 330 as a quasi-two-dimensional layer structure, the term "electric resistivity" has to be interpreted as the sheet resistance or square resistance of the respective layer structure. According to the embodiment depicted in FIG. 1A, the gate resistor structure 310 is electrically coupled between the gate line 510 and the gate electrode layer 330, whereas in the embodiment depicted in FIG. 1B, the gate resistor structure 310 is electrically coupled between the gate pad 520 and the gate line 510.

According to another embodiment depicted in FIG. 1C, a semiconductor device 10 comprises a semiconductor body 100 having a first surface 101 and a second surface 102 opposite to the first surface 101. A transistor cell structure 1000 is provided in the semiconductor body 100. The semiconductor device 10 further comprises a gate contact structure 500. The gate contact structure 500 comprises a gate line 510 electrically coupled to a gate electrode layer 330 of the transistor cell structure 1000, and a gate pad 520 electrically coupled to the gate line 510. A gate interconnecting structure 320 comprises gate interconnecting elements 325. The gate interconnecting elements 325 protrude from the gate electrode layer 330 and are electrically coupled in parallel to the gate line 510. The minimum resistance of the gate interconnecting elements 325 is greater than 40 Ohm.

By integrating the gate resistor structure 310 or the gate interconnecting structure 320 in the electrical pathway between the gate pad 520 and the gate electrode layer 330, the switching behaviour of the transistor cell structure 1000 in the semiconductor body 100 can be optimized, thereby enabling improved chip dynamics and robustness under some application conditions.

Figure 2B:
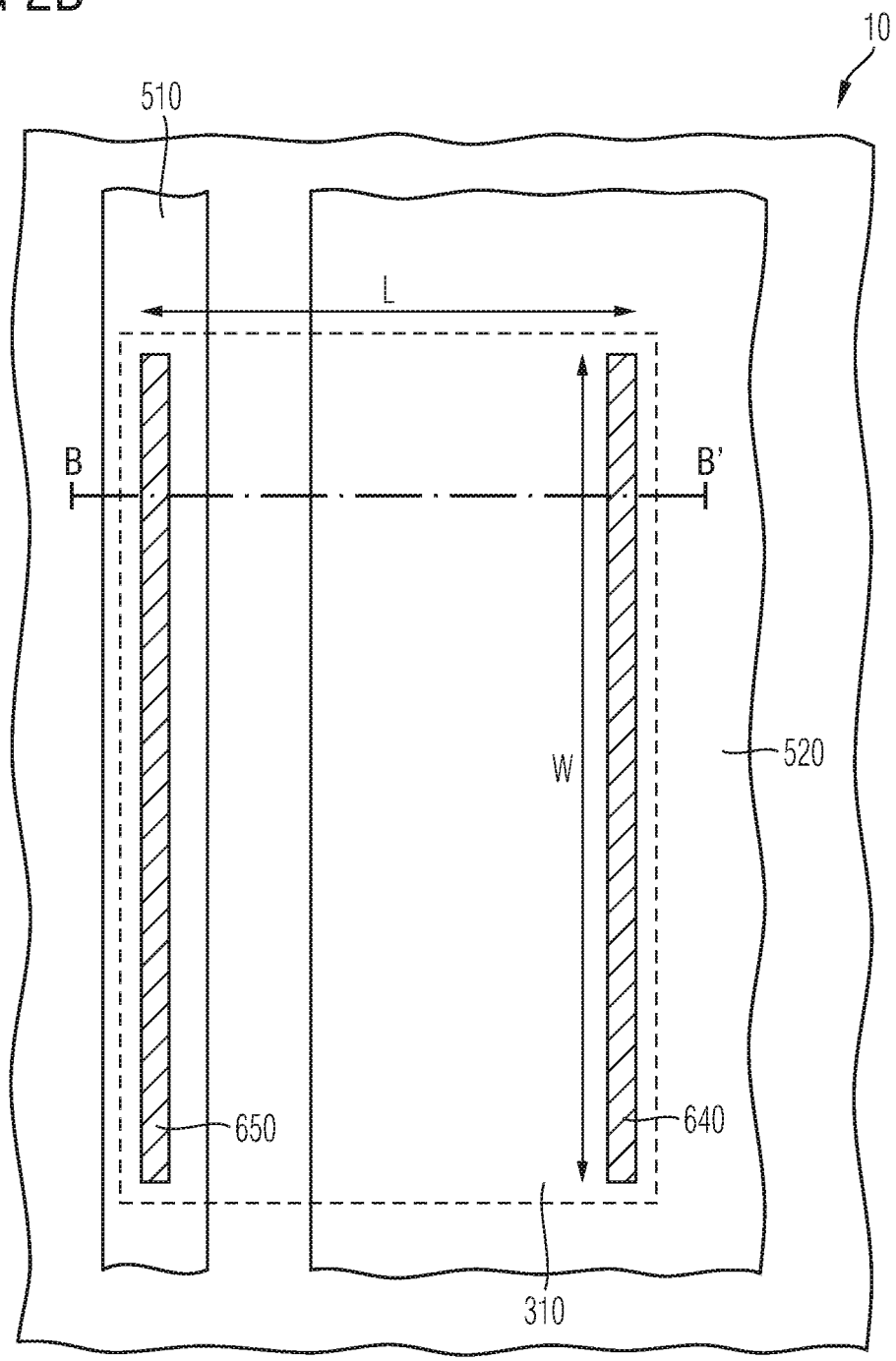
Figure 3A:
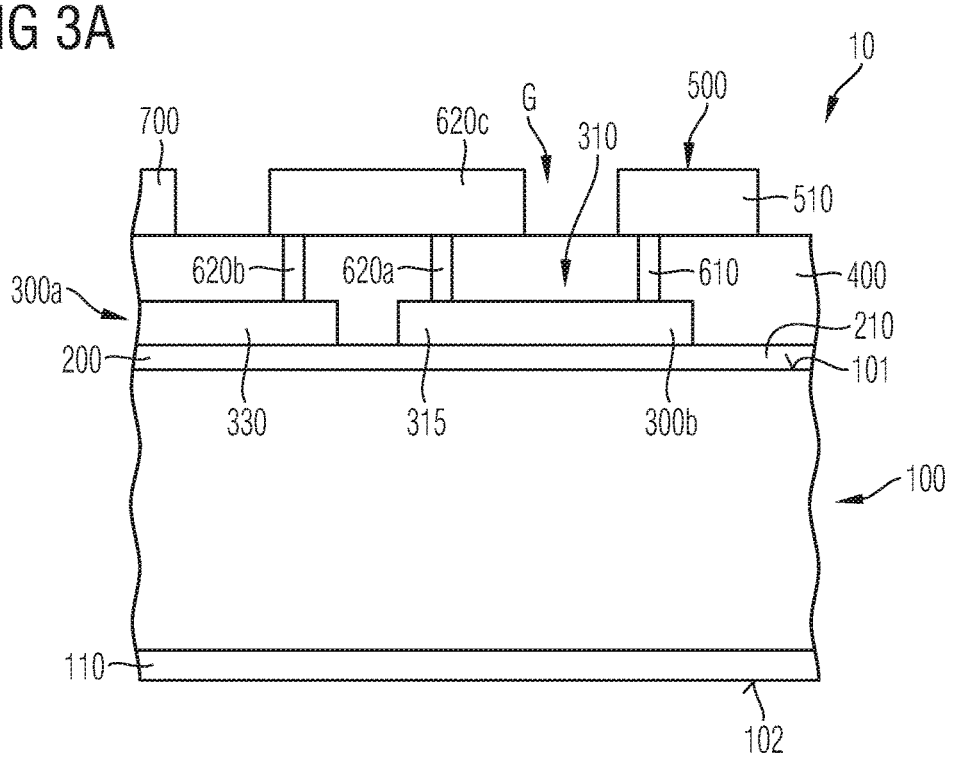
FIG. 3A is a schematic cross-sectional view of a portion of a semiconductor device taken along the section plane A-A' of FIG. 2A.

FIG. 2A is a schematic plan view for illustrating a portion of a semiconductor device 10 in accordance with an embodiment, and FIG. 3A is a schematic cross-sectional view of a portion of the semiconductor device 10 taken along the section plane A-A' of FIG. 2A.

The semiconductor device 10 may comprise power semiconductor elements such as IGBTs (insulated gate bipolar transistors), e.g. RC-IGBTs (reverse-conducting IGBTs), RB-IGBT (reverse-blocking IGBTs), and IGFETs (insulated gate field effect transistors) including MOSFETs (metal oxide semiconductor field effect transistors). The semiconductor device 10 may also comprise a super-junction transistor, a trench field effect transistor, or any further transistor device that allows for controlling a load current via a gate terminal. When reducing the chip size of the semiconductor device 10, a smaller input capacitance may result in an enhanced risk of damage caused by an electrostatic discharge event between the gate and the source of the semiconductor device 10.

The semiconductor body 100 may, for example, be based silicon Si, silicon carbide SiC, germanium Ge, a silicon germanium crystal SiGe, gallium nitride GaN or gallium arsenide GaAs. A distance between the first and second surfaces 101, 102 may be set depending on a desired or specified voltage blocking capability and may be at least 5 µm, or at least 20 µm, or at least 50 µm. A distance between the first and second surfaces 101, 102 may be at least 5 µm in case of a silicon carbide body 100. Some other embodiments may be based on a semiconductor body 100 having a thickness of one or several 100 µm. The semiconductor body 100 may have a rectangular shape with an edge length in the range of 500 µm up to several millimeters or centimeters.

The semiconductor body 100 may comprise, as will be further described with reference to FIG. 3D, a drain region 110 and a drift region 120. The semiconductor device 10 may comprise a first isolation layer 200 on the first surface 101 of the semiconductor body 100, wherein the gate resistor structure 310 and the gate electrode layer 330 are abutting the first isolation layer 200. The first isolation layer 200 may be formed on the first surface 101 of the semiconductor body 100. The first isolation layer 200 may include any dielectric or a combination of dielectrics configured to electrically isolate the semiconductor body 100 from the gate resistor structure 310 or from the gate electrode layer 330 on the first isolation layer 200. The first isolation layer 200 may include one or any combination of an oxide, a nitride, an oxynitride, a high-k material, an imide, an insulating resin or glass, for example. The first isolation layer 200 may include a field oxide formed by e.g. thermal oxidation or deposition, for example chemical vapor deposition or by a local oxidation of silicon (LOCOS) process or STI (shallow trench isolation) process.

The first isolation layer 200 may comprise a field dielectric layer 210. In one or more embodiments, the first isolation layer 200 may include a field dielectric, for example a field oxide in an overlap area between the gate resistor structure 310 and the semiconductor body 100 and may further include a gate dielectric, for example a gate oxide within an area of the transistor structure 1000. In one or more embodiments, a thickness of the field dielectric of the first isolation layer 200 may be in a range from 0.5 µm to 5 µm, or in a range from 1 µm to 3 µm, and the thickness of the gate dielectric of the first isolation layer 200 may be in a range from 5 nm to 200 nm, or in a range from 40 nm to 120 nm.

The semiconductor device 10 may further comprise a second isolation layer 400 on the gate resistor structure 310 and the gate electrode layer 330, wherein the gate contact structure 500 is formed on the second isolation layer 400. The second isolation layer 400 may comprise a stack of dielectric layers, for example. In one or more embodiments, a first dielectric layer of the second isolation layer 400 may include a tetraethylorthosilicate (TEOS)/undoped silicate glass (USG) film. The thickness of the first dielectric layer of the second isolation layer 400 may be in a range from 50 nm to 500 nm, for example. A second dielectric layer of the second isolation layer 400 may include a phosphosilicate glass (PSG) or a borophosphosilicate glass (BPSG). The thickness of the second dielectric layer of the second isolation layer 400 may be in a range from 200 nm to 2 µm, for example.

Referring to FIG. 2A, the semiconductor device 10 further comprises a source contact structure 700 overlapping the transistor cell structure 1000. The source contact structure 700 is electrically connected to source regions 150 of the transistor cell structure 1000, as will be further described with reference to FIG. 3D below. The gate contact structure 500 may be formed on the second isolation layer 400, for example. Next to the gate contact structure 500, the source contact structure 700 may be formed on the second isolation layer 400, which may be spaced apart from a part of the gate contact structure 500. On the gate contact structure 500 and the source contact structure 700, a further passivation layer may be formed, which may include one or any combination of an imide, a nitride, an oxide or an oxynitride, for example.

The gate contact structure 500 may comprise a metal. The source contact structure 700 may comprise a metal as well. The source contact structure 700 and the gate contact structure 500 may be patterned parts of one and the same conductive material. The source contact structure 700 and the gate contact structure 500 may be patterned parts of one and the same metal layer. In one or more embodiments, a first part of the metal layer corresponds to the source contact structure 700 and a second part of the metal layer corresponds to the gate contact structure 500, the first and second parts being separate parts of one and the same metal wiring layer. The gate contact structure 500 and the source contact structure 700 may be separate parts of a common metal wiring layer or a common stacked layer that has undergone lithographic patterning, for example. The gate contact structure 500 and the source contact structure 700 may be formed as a metal layer structure including first to third electric contact structures 610, 620 and 630. The metal layer structure may include, as main constituent(s), aluminum Al, copper Cu or alloys of aluminum or copper, for example AlSi, AlCu, or AlSiCu. According to some other embodiments, the gate contact structure 500 and the source contact structure 700 may be formed of one, two, three or more sub-layers, each sub-layer including, as a main constituent, at least one of nickel Ni, titanium Ti, silver Ag, gold Au, tungsten W, platinum Pt and palladium Pd. For example, a sub-layer may contain a metal nitride or a metal alloy containing Ni, Ti, Ag, Au, W, Pt, Pd and/or Co.

Referring to FIG. 3A and FIG. 2A, the gate resistor structure 310 may comprise gate resistor elements 315 electrically coupled in parallel between the gate line 510 and the gate electrode layer 330 of the transistor cell structure 1000. Referring to FIG. 3A, one terminal of the gate resistor element 315 may be electrically connected with the gate line 510 by a first electric contact structure 610 and another terminal of the gate resistor element 315 may be electrically connected with the gate electrode layer 330 by a second electric contact structure 620. The second electric contact structure 620 may include two electric contact elements 620a and 620b extending along a vertical direction z through the second isolation layer 400, which are electrically shunted by a bridging element 620c on the second isolation layer 400. Referring to FIG. 3D, third electric contact structures 630 may be provided to interconnect the source contact structure 700 with the source regions 150 of the transistor cell structure 1000.

The gate electrode layer 330 may comprise a polycrystalline silicon layer 300a, for example. The polysilicon layer 300a of the gate electrode layer 330 may be of an n-type doping, and a net dopant concentration may be in a range from $1 \times 10^{19}$ cm$^{-3}$ to $5 \times 10^{23}$ cm$^{-3}$, for example. The gate electrode layer 330 may comprise a polycrystalline silicon layer 300a having a sheet resistance of smaller than 50 Ohm/square. The sheet resistance of the polycrystalline silicon layer 300a of the gate electrode layer 330 may be in a range from 1 Ohm/square (1 Ω/☐) to 50 Ohm/square, or in a range between 5 Ohm/square to 20 Ohm/square, or in a range from 7 Ohm/square to 12 Ohm/square, for example. The gate electrode layer 330 may be a conductive layer electrically connected with the respective gate electrodes of the transistor cell structure 1000, wherein the gate electrode may be, for example, a trench gate electrode or, as depicted in FIG. 3D, a planar gate electrode.

The gate resistor structure 310 may comprise a polycrystalline silicon layer 300b. The polycrystalline silicon layer 300b of the gate resistor structure 310 may be of a p-type doping. The polycrystalline silicon layer 300b of the gate resistor structure 310 may also be of an n-type doping. The net dopant concentration of the polycrystalline silicon layer 300b may be in a range from $5 \times 10^{17}$ to $1 \times 10^{19}$ cm$^{-3}$, for example. The gate resistor structure 310 may comprise a polycrystalline silicon layer 300b having a sheet resistance of more than 10 Ohm/square, or more than 20 Ohm/square, or more than 50 Ohm/square, or more than 100 Ohm/square, or even more than 150 Ohm/square. A sheet resistance of the polycrystalline silicon layer 300b may be in a range from 10 Ohm/square to 200 Ohm/square, or in a range from 50 Ohm/square to 150 Ohm/square, for example. According to some embodiments, the sheet resistance of gate resistor structure 310 may be greater than the sheet resistance of the gate electrode layer 330.

The gate resistor structure 310 and the gate electrode layer 330 may be separate parts of one and the same polysilicon layer 300 that has undergone lithographic patterning, for example. In this case, the polysilicon layer 300 may be patterned into the polycrystalline silicon layer 300a and into the polycrystalline silicon layer 300b. Resistivity of the polycrystalline layers 300a, 300b may differ from one another, for example by doping with different dopant concentrations or by doping with dopants of different conductivity type. In some embodiments, the polycrystalline silicon layer 300 may initially have a low dopant concentration and then be doped for setting different dopant concentrations of the same conductivity type, for example. The polycrystalline silicon layer 300 may also be a polycrystalline silicon layer having an initially set high dopant concentration, for example set by in-situ doping, that is equal to the net dopant concentration of the gate electrode layer 330, wherein the part of the patterned polysilicon layer 300 constituting the gate resistor structure 310 may have a lower net dopant concentration set by counter-doping with dopants of an opposite conductivity type. In some other embodiments, the gate resistor structure 310 and the gate electrode layer 330 may be formed by different deposition processes. In this case, the polycrystalline silicon may be deposited with a predetermined in-situ net dopant concentration resulting in a predetermined sheet resistance of the respective layers.

Referring to FIGS. 2A and 3A, the gate resistor structure 310 comprising the at least one gate resistor element 315 may be coupled between the gate lines 510 and the gate electrode layer 330. Referring to another embodiment illustrated in FIGS. 2B and 3B, the gate resistor structure 310 may be also coupled between the gate pad 520 and the gate line 510. The thickness of the polycrystalline silicon layer 300b of the gate resistor structure 310 may be in a range from 200 nm to 1000 nm, or in a range from 400 to 800 nm, for example. In one or more embodiments, the sheet resistance of the gate resistor structure 310 may be at least two times larger, or at least five times larger, or at least ten times larger than the sheet resistance of the gate electrode layer 330. The polycrystalline silicon layer 300b of the gate resistor structure 310 may also be p-doped in a range from $1\times10^{18}$ to $1\times10^{20}$ cm$^{-3}$, or in a range from $1\times10^{19}$ to $1\times10^{20}$ cm$^{-3}$, or in a range from $2\times10^{19}$ to $6\times10^{19}$ cm$^{-3}$. Thus, the polycrystalline silicon layer 300b of the gate resistor structure 310 may be of an opposite conductivity type than the polycrystalline layer 300a of the gate electrode layer 330. In combination with a buried p-doped shielding layer, the polycrystalline silicon layer 300b of the gate resistor structure 310 having a p$^+$-doping may allow for withstanding back gate effects, for example.

Figure 3B:
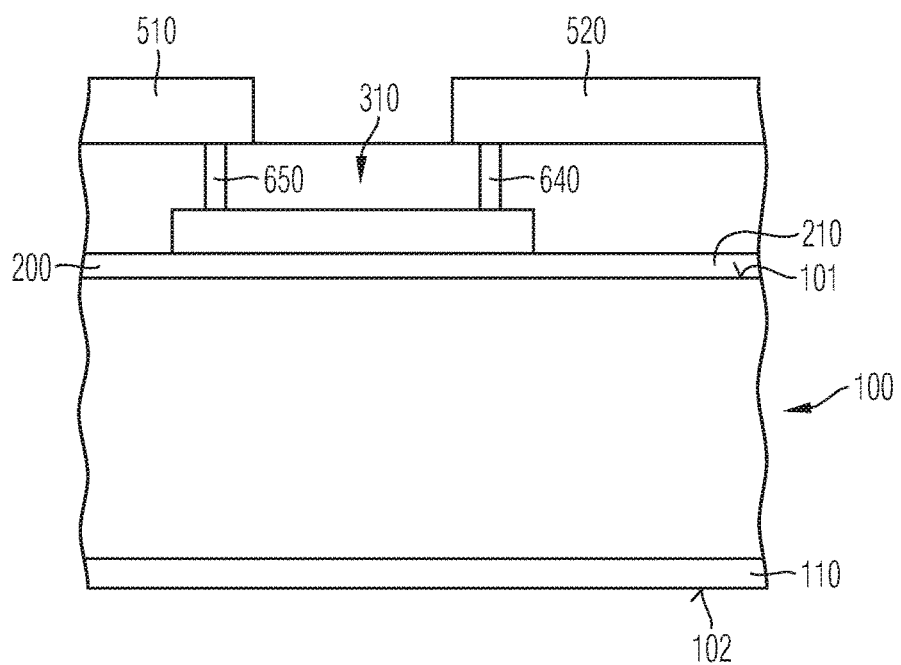
FIG. 3B is a schematic cross-sectional view of a portion of a semiconductor device taken along the section plane B-B' of FIG. 2B.

Referring to FIG. 2B, setting a sheet resistance of the polycrystalline silicon layer 300b of the gate resistor structure 310 larger than 10 Ohm/square may allow for setting an aspect ratio of a length L to a width W of the gate resistor structure 310 being located in an overlapping area between the gate pad 520 and the semiconductor body 100 of smaller than 1. Thus, in case of setting an integrated resistance between the gate pad 520 and the gate line 510 to a value larger than 40 Ohm, the aspect ratio L/W may be chosen larger than 40 Ohm/square. As a result, the width W of the first electric contact structure 610 can be set at a beneficial larger value when the dimensions of the gate pad 520 are reduced in size. Thus, an integration of a resistor between the gate pad 520 and the gate line 510 having larger resistance values is made available together with a scalable aspect ratio W/L for choosing contact stripes with larger width W than available by using a gate resistor structure 310 having the same sheet resistance as the gate electrode layer 330. Referring to FIGS. 2B and 3B, one terminal of the gate resistor structure 310 is electrically connected with the gate pad 520 by a fourth electric contact structure 640 and another terminal of the gate resistor structure 310 is electrically connected with the gate line 510 by a fifth electric contact structure 650.

For avoiding a Schottky contact between the gate resistor structure 310 and the gate pad 520 or the gate line 510, the first, second, fourth and fifth electric contact structures 610, 620, 640, and 650 may be formed by a stacked layer structure of a p$^{++}$-bottom layer being in contact with the gate resistor structure 310, a buried silicide layer of TiSi being in contact with the p$^{++}$-bottom layer and a n$^{++}$ polycrystalline silicon layer being in contact with the buried silicide layer and, on its top side, being in contact with the gate pad 520 or the gate line 510.

As regards the contacting structure of the fourth and fifth electric contact structure 640, 650 with polysilicon plugs (or W-plugs) in the polycrystalline silicon layer 300b, the buried (p$^+$) region together with the buried silicide (TiSi) adjoining underneath the polysilicon plugs (or W-plugs) may be used for contacting the buried (p$^+$)-contact implantation zone as well as the (p$^+$)-doped resistor zone. In case of the (n$^+$)-polycrystalline silicon plugs, the vertical (n$^+$)-silicide-(buried p$^+$) interface regions may act as an electron-to-hole converter. Thus, when a gate resistor structure 310 is desired having absolute resistance values larger than 50 Ohm, the provision of a gate resistor structure 310 having a high sheet resistance can be more easily integrated under the gate pad 520 and a contact width of the gate resistor structure 310 provided by the fourth and fifth electric contact structure 640, 650 may be enhanced.

FIGS. 2C and 3C depict a semiconductor device 10 according to a further embodiment. Referring to FIG. 2C, a gate interconnecting structure 320 comprises gate interconnecting elements 325 protruding from the gate electrode layer 330 and being electrically coupled in parallel to the gate line 510. Referring to FIGS. 2C and 3C, the gate interconnecting structure 320 and the gate electrode layer 330 are integrally formed by a common electrode layer of polycrystalline silicon. Thus, the gate electrode layer 330 is formed simultaneously with the gate interconnecting elements 325 and may be part of the polycrystalline silicon layer 300. In one or more embodiments, the gate interconnecting elements 325 may be formed as comb segments protruding from the gate electrode layer 330 in a lateral plane. Further features illustrated in FIGS. 2C and 3C are similar to corresponding features of the structure illustrated in FIGS. 2A and 3A.

FIG. 3D is a schematic cross-sectional view of a portion of a semiconductor device 10 taken along the section plane C-C" of FIG. 2C. Referring to FIG. 2C, the part of the semiconductor device 10 taken along the section plane C-C" illustrates the transistor structure 1000 of the semiconductor device 10. The transistor structure 1000 comprises transistor cells 1100 arranged in an overlapping area between the source contact structure 700 and the semiconductor body 100. Each of the transistor cells 1100 comprise the gate electrode layer 330 formed on the first isolation layer 200 constituting a gate dielectric layer 220, the source regions 150 being in contact with the first surface 101 of the semiconductor body 100 and extending into the semiconductor body 100, and body regions 160, in which the source regions 150 are embedded. The source regions 150 are of the first conductivity type and the body regions 160 are of the second conductivity type. Furthermore, the drain region 110 of the first conductivity type is arranged at the second surface 102 of the semiconductor body 100. The drift region 120 is formed between the drain region 110 and the body regions 160 and is of a first conductivity type. In case of a super-junction device, semiconductor regions of the first conductivity type and of the second conductivity may be alternatingly arranged along a lateral direction and interposed between the drain region 110 and the body regions 160. The semiconductor regions of the first conductivity type may act as drift regions and the semiconductor regions of the second conductivity type may act as charge compensation regions, for example.

FIG. 4 is a schematic plan view of a portion of the semiconductor device 10 in accordance with another embodiment. Referring to FIG. 4, the gate contact structure 500 comprises the gate line 510 and the gate pad 520. The gate pad 520 and the gate line 510 may be formed of a metal. The source contact structure 700, the gate contact structure 500 comprising the gate line 510 and the gate pad 520, as well as a drain line 800 may be formed as separate parts of one and the same patterned metal wiring layer or metal wiring layer stack, for example.

The gate line 510 may be a so-called gate runner structure at an edge portion of the semiconductor device 10. The gate line 510 may, however, also be a gate finger structure arranged within a transistor cell array of the semiconductor device 10. In one or more embodiments, the gate line 510 may surround at least partly the source contact structure 700 within the lateral plane. A gap G may be formed in an edge termination area 900, as can be seen, for example in FIGS. 6A and 6B. The edge termination area 900 may comprise a high voltage edge termination structure.

In the following, a number of embodiments of gate resistor structures 310 (see FIGS. 5A and 5B) and of gate interconnecting structures 320 (see FIGS. 5C and 5D) will be described. The respective detailed portions illustrated in FIG. 5A to 5D may be located as shown in FIG. 4 at portions A, B, or C, for example.

Figure 5A:
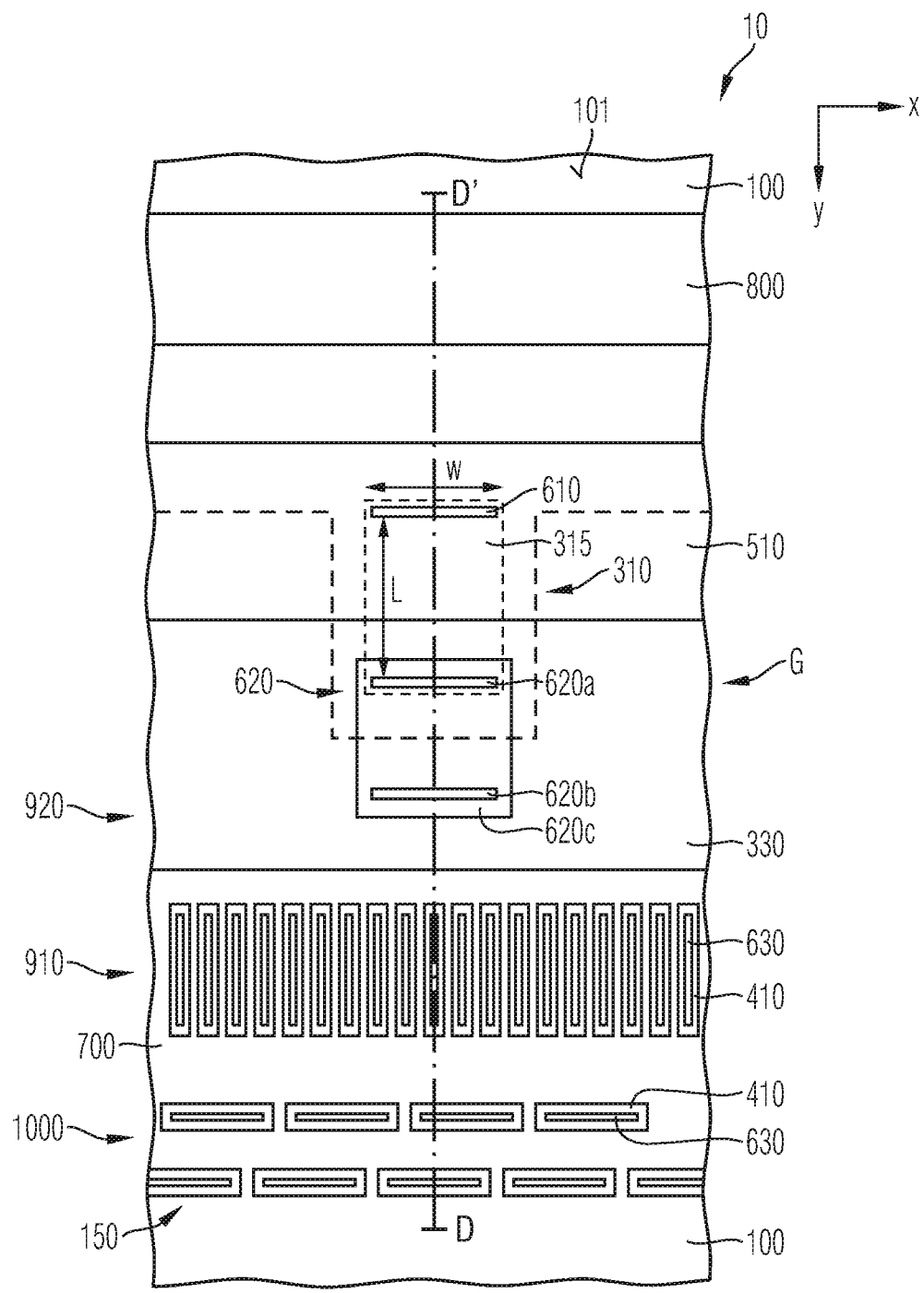
FIGS. 5A to 5D are schematic plan views of portions A, B, and C identified in FIG. 4 for illustrating a number of embodiments.
Figure 6A:
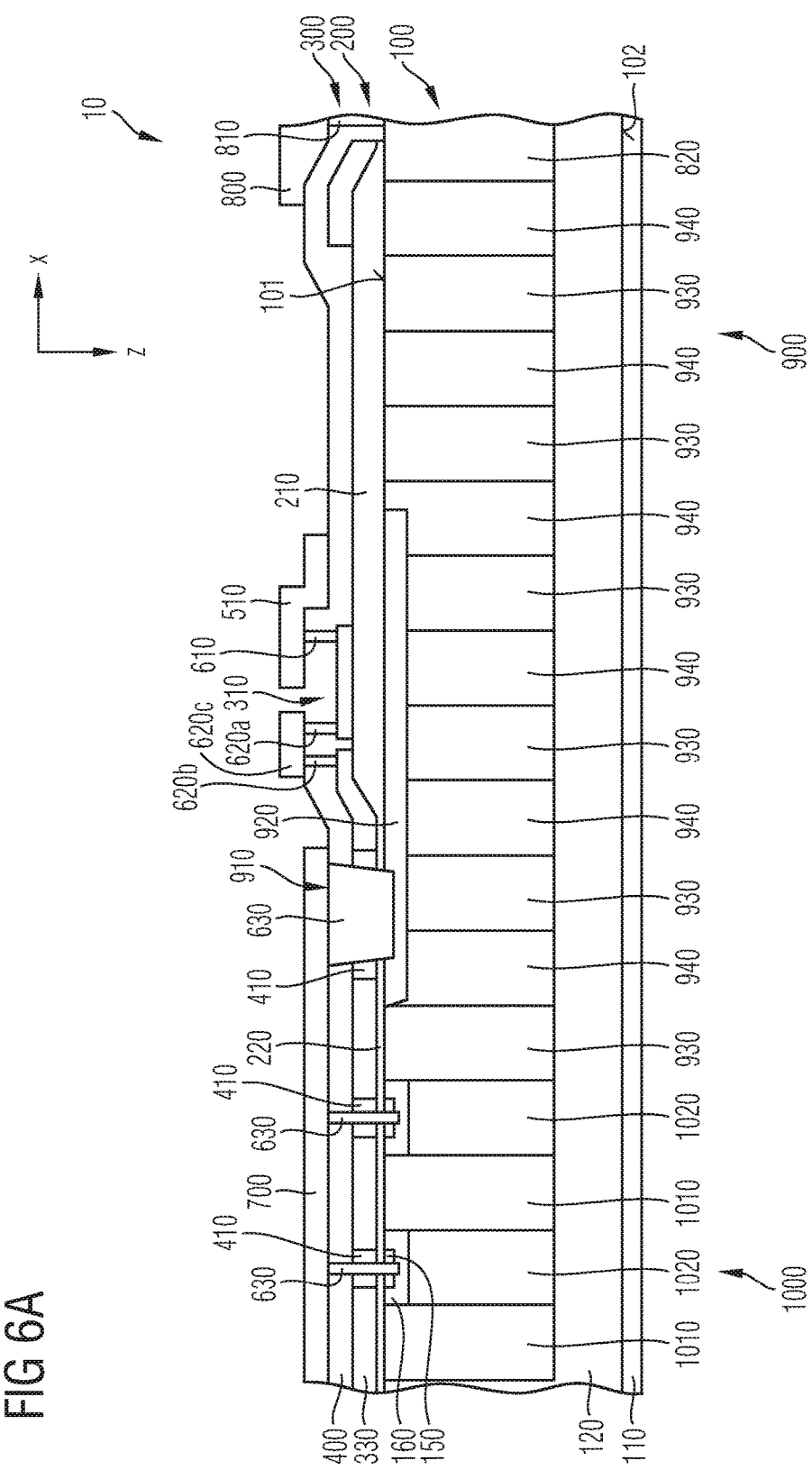
FIGS. 6A and 6B are schematic cross-sectional views taken along the section plane D-D' of FIG. 5A and the section plane E-E' of FIG. 5C, respectively.

Referring to FIG. 5A and FIG. 6A, the gate resistor structure 310 comprising the gate resistor element 315 may be electrically coupled between the gate line 510 or gate ring and the gate electrode layer 330 via the first and second electric contact structures 610, 620. The first electric contact structure 610 may be formed as a polycrystalline silicon plug or a metal contact, for example. The second electric contact structure 620 comprises two electric contact elements 620a, 620b, which are electrically shunted by the bridging element 620c. The bridging element 620c, the source contact structure 700 and the gate line 510 of the gate contact structure 500 may be separate parts of one and the same metal wiring layer.

In case of forming the bridging element 620c, the gate line 510 and the source contact structure 700 as separate parts of one and the same wiring layer, for example by a metal etch process, the thickness of the metal wiring layer constituting the gate line 510, the bridging element 620c and the source contact structure 700 may be set smaller than 2 µm in order to provide a gap between the bridging element 620c and the gate line 510 of at least 1 µm, for example.

Figure 5B:
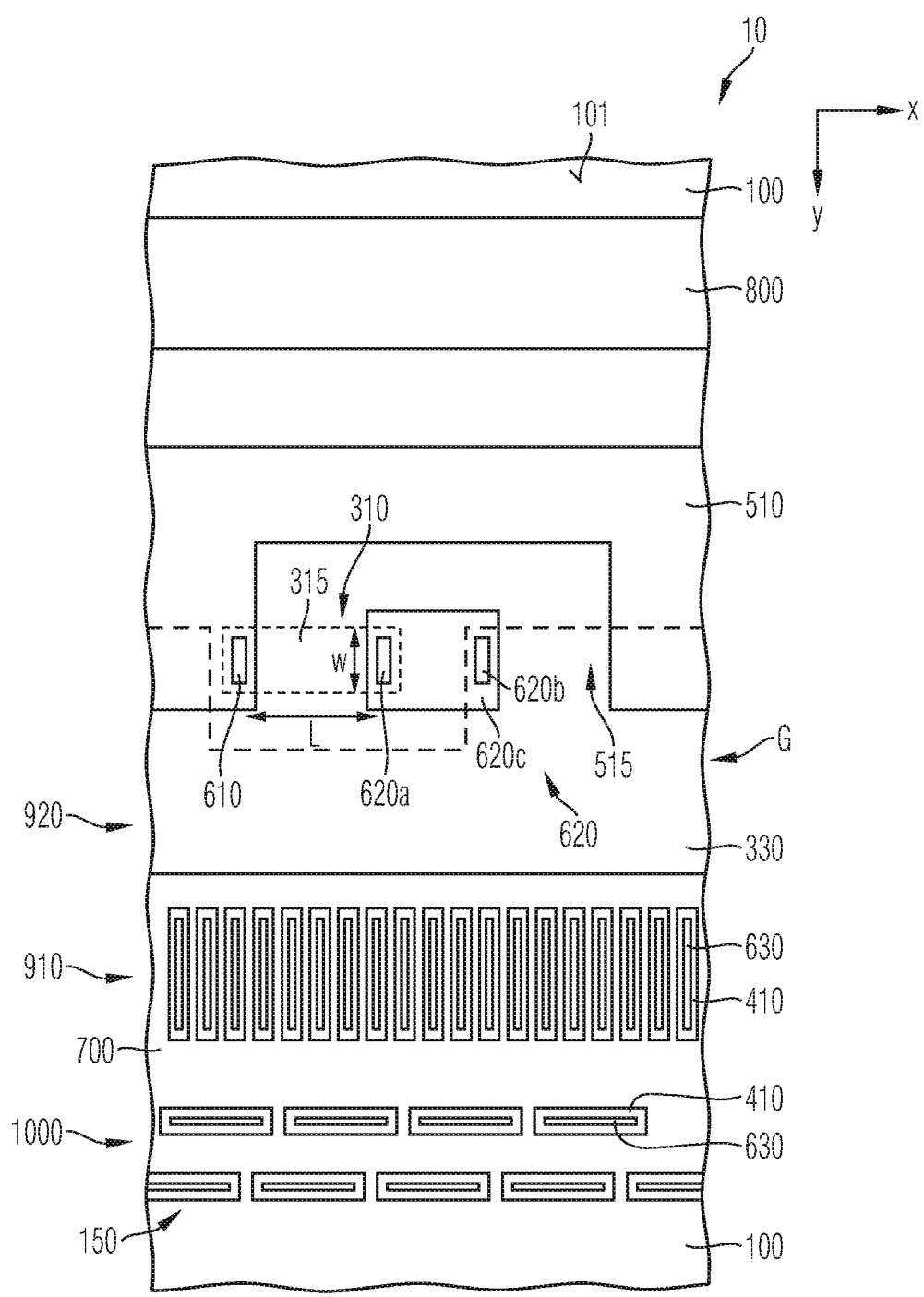

In case of using a metal wiring layer constituting the gate line 510, the bridging element 620c and the source contact structure 700 with a thickness greater than 5 µm, respective gaps of at least 1 µm may be provided when using an anisotropic plasma etching process for patterning the metal wiring layer. The electric contact elements 620a and 620b may be formed as polycrystalline silicon plugs or metal contacts, for example. A distance from an edge of the gate electrode layer 330 to the gate current distributing cells 910 may be set to more than 10 µm, thereby allowing the gate current to distribute homogeneously over the active area of the gate electrode layer 330. The gate current distributing cells 910 comprise third electric contact structures 630 between the source contact structures 700 and a well region 920, as can be seen from FIG. 6A. As can be further seen from FIG. 5A, the third electric contact structures 630 for connecting the source contact structures 700 with the source regions 150 are formed as interrupted stripes extending in parallel along a first lateral direction x, along which the gate line 510 extends at the respective portion, whereas the gate current distributing cells 910 are arranged as longitudinally extended third electric contact structures 630 being arranged perpendicular to the first lateral direction x. Referring to FIGS. 5A and 5B, an edge portion of the gate resistor structure 310 and an edge portion of the gate electrode layer 330 may be arranged along a same line parallel to the gate line 510. The edge portion of the gate resistor structure 310 and the edge portion of the gate electrode layer 330 may be thus arranged along a same line in parallel along the first lateral direction x, along which the gate line 510 extends at the respective portion. The edge portion of the gate resistor structure 310 and the edge portion of the gate electrode layer 330 may be located in an overlapping region between the gate line 510 and the semiconductor body 100. The edge portion of the gate resistor structure 310 and the edge portion of the gate electrode layer 330 may be part of the edge termination area 900.

As can be seen from FIG. 6A, the third electric contact structures 630 extend along the vertical direction z through the second isolation layer 400 and the gate electrode 330, which is formed by the polysilicon layer 300, and through the gate dielectric layer 220 of the first isolation layer 200 into the semiconductor body 100, thereby electrically connecting the source contact structure 700 with the source regions 150. To prevent a shortcut between the third electric contact structures 630 and the gate electrode 330, contact holes extending through the gate electrode 330 are further isolated by a dielectric lining layer 410.

The third electric contact structures 630 of the gate current distributing cells 910 extend through the second isolation layer 400, the gate electrode 330 adjoining the dielectric lining layer 410 for insulating the third electric contact structure 630 from the gate electrode 330, and through the first isolation layer 200 into the semiconductor body 100, thereby contacting the source contact structure 700 with the well region 920 of a second conductivity type. The conductivity types of the source regions 150, the body regions 160 or further structures of the transistor cells 1100 may be as described above with reference to FIG. 3D.

As can be further seen from FIG. 6A, the gate resistor structure 310 and the gate electrode layer 330 are formed on the field dielectric layer 210 within the edge termination area 900 of the semiconductor device 10. In other words, the first isolation layer 200 is formed as a gate dielectric 220 within the active area of the transistor structure 1000, whereas the first isolation layer 200 is formed as a field dielectric layer 210 within the edge termination area 900. Furthermore, semiconductor regions 1010 of the first conductivity type, for example columns or stripes and semiconductor regions 1020 of the second conductivity type may be implemented beneath the active transistor top cell structure of the transistor structure 1000. In addition, semiconductor regions 930 of the first conductivity type and semiconductor regions 940 of the second conductivity type may be implemented beneath the well region 920 of the edge termination area 900.

As can be further seen from FIG. 6A, the drain line 800 is connected to a drain connection column 820 within the semiconductor body 100 by means of a sixth electric contact structure 810, which vertically extends through the second isolation layer 400, the polysilicon layer 300 and the first isolation layer 200 into the semiconductor body 100. The drain connection column 820 is of a first conductivity type and extends from the first surface 101 into the semiconductor body 100, to electrically couple the drain region 110 on the second surface 102 with the drain line 800 formed over the first surface 101 of the semiconductor body 100.

FIG. 5B illustrates another embodiment of a semiconductor device 10 comprising a gate resistor structure 310. As can be seen from FIG. 5B, at least a part of the second electric contact structure 620 may be located within a lateral recess 515 of the gate line 510. By providing the bridging element 620c of the second electric contact structure 620 at least partly within the lateral recess 515 of the gate line 510, the distance of the bridging element 620c to the gate line 510 and the source contact structures 700 can be enlarged to a dimension greater than 10 µm, for example. Thus, a metal wiring layer or layer stack constituting the gate line 510 after patterning, the bridging element 620c, and the source contact structure 700 having a thickness of greater than 2.5 µm can be patterned with a metal wet etching process instead of anisotropic etching with a plasma etching process, for example.

In order to contact the bridging element 620c with the gate electrode layer 330 via the contact element 620b, the gate electrode layer 330 may extend into the lateral recess 515 of the gate line 510. The lateral recess 515 is to be understood as a cut out portion of the gate line 510 at a side of the gate line 510 facing the transistor cell structure 1000. The lateral recess 515 may have a form of a rectangle, for example, wherein the dimension of the rectangle along the first lateral direction x, along which the gate line 510 is extended at the respective portion, may be greater than the dimension perpendicular to the first lateral direction x. Thus, by arranging the gate resistor element 315 in a direction parallel to the first direction x, the aspect ratio L/W of the gate resistor element 315 may be set greater than 1, or may be greater than 2, or may be greater than 3, or may be greater than 4, or may be even greater than 5. By tuning the length L and the width W of the gate resistor element 315, the resistance value may be adjusted in a flexible way.

Figure 5C:
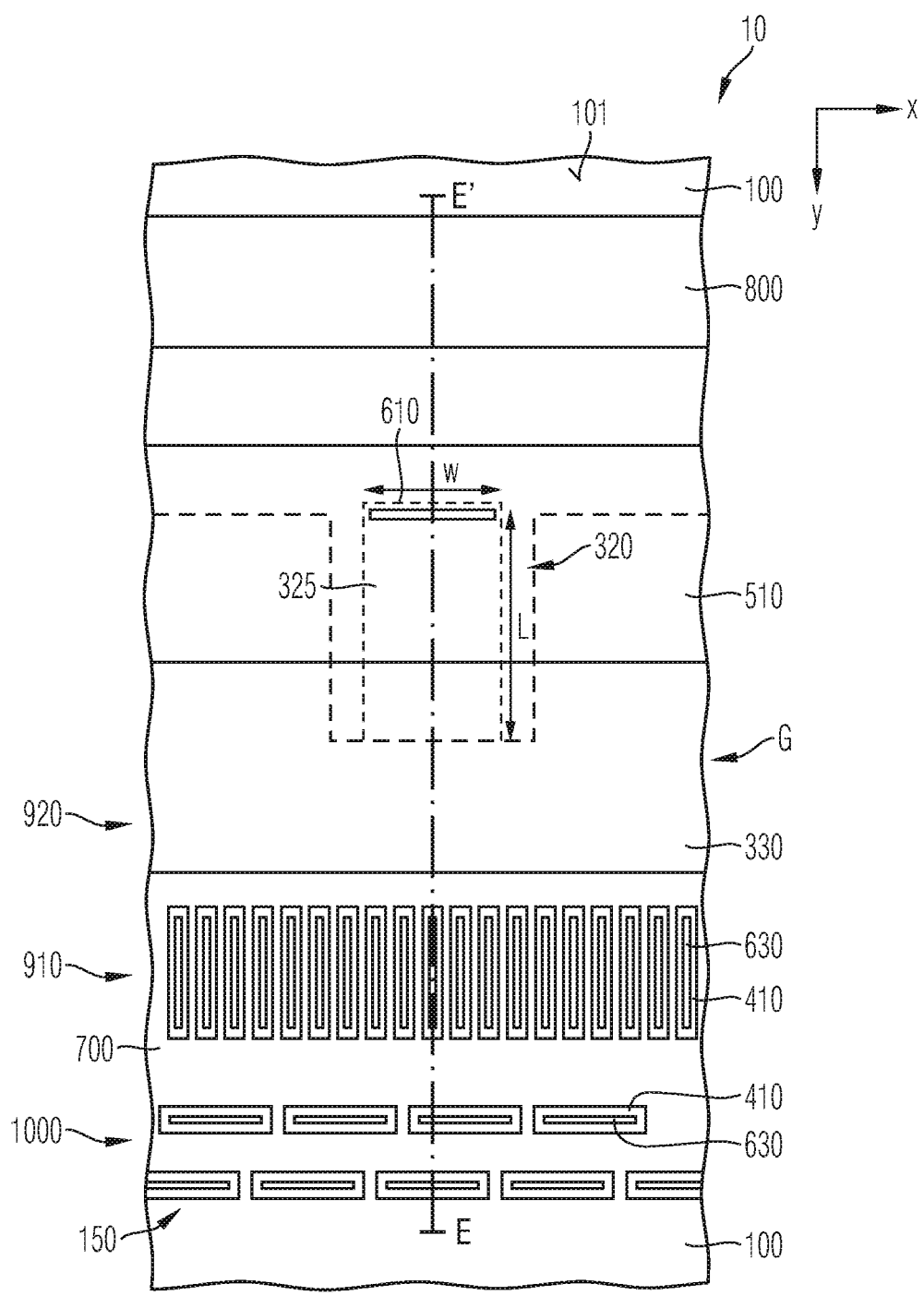
Figure 6B:
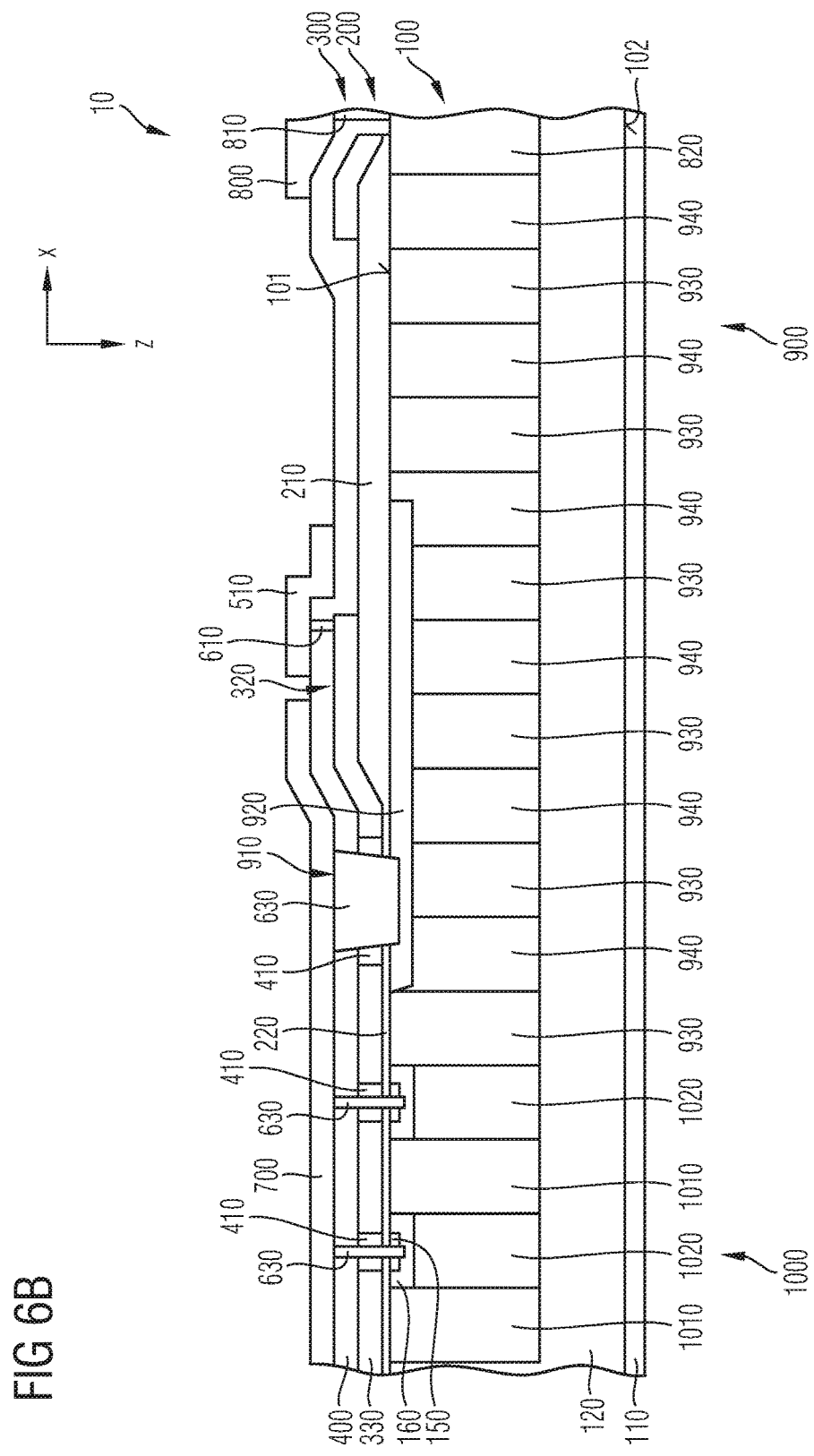

FIGS. 5C and 6B illustrate an embodiment of a semiconductor device 10 comprising a gate interconnecting structure 320. Details of some features illustrated in FIG. 5C and in the cross-sectional view in FIG. 6B have already been described with regard to FIGS. 5A and 6A, thus only additional details will be described further below. The gate interconnecting element 325 may protrude from the gate electrode layer 330 towards the gate line 510 and may be electrically coupled to the gate line 510 via the first electric contact structure 610. The gate interconnecting element 325 may be integrally formed with the gate electrode layer 330 and thus may have the same electrical sheet resistance. By tuning the length L and the width W of the gate interconnecting element 325, the resistance value of the gate interconnecting element 325 can be adjusted in a flexible way. Taking a sheet resistance of the gate electrode layer 330 and the gate interconnecting element 325 of 10 Ohm/square, an aspect ratio L/W of 4, for example, leads to an electrical resistance of 40 Ohm. According to an embodiment, the minimum resistance of the gate interconnecting elements 325 is greater than 40 Ohm.

Figure 5D:
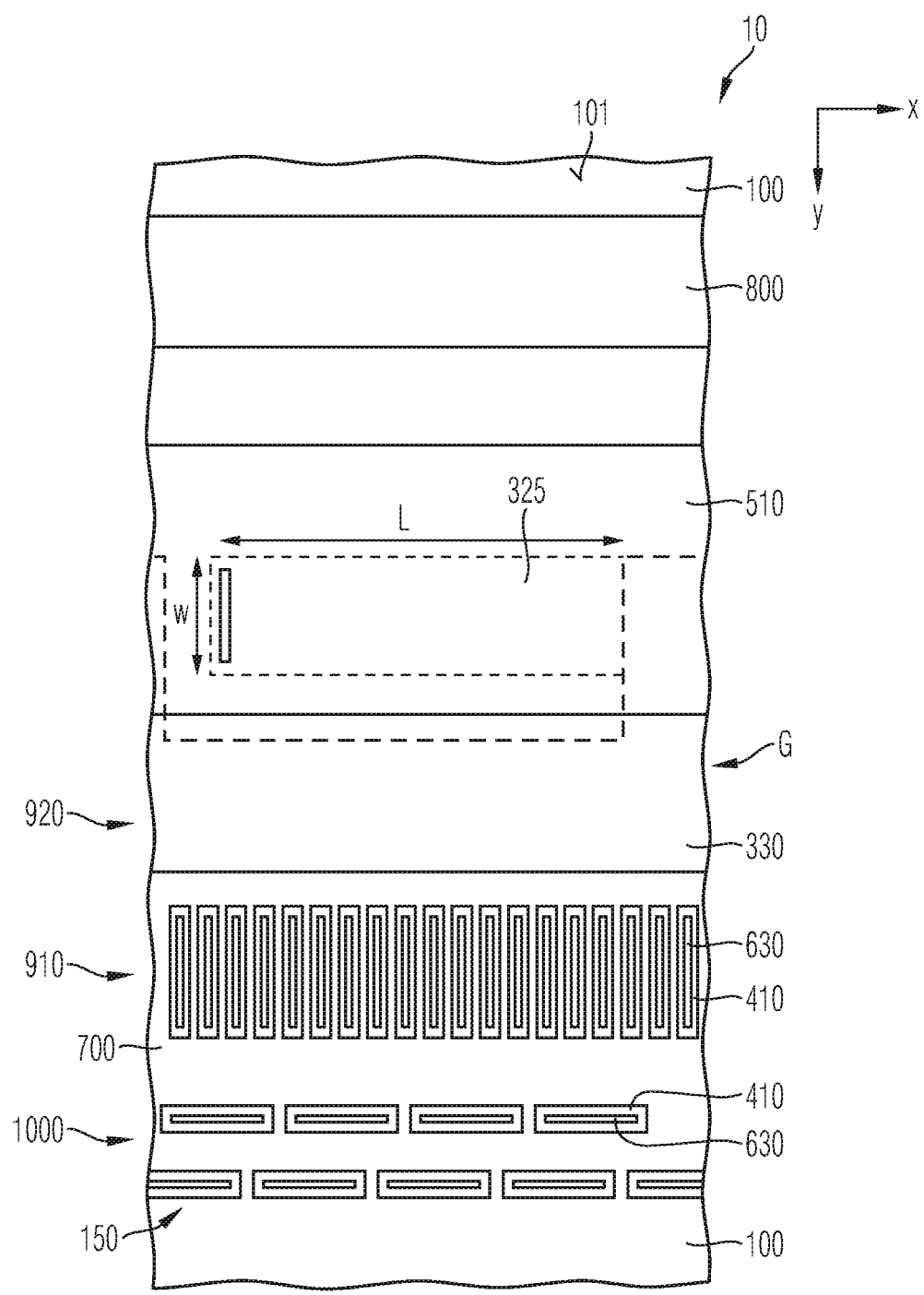

FIG. 5D illustrates a further embodiment of the semiconductor device 10 comprising a gate interconnecting element 325 being arranged in a different geometry as the gate interconnecting element 325 of FIG. 5C. As can be seen from FIG. 5D, the gate electrode layer 330 is extended in an overlapping area between the gate line 510 and the semiconductor body 100, wherein the gate interconnecting element 325 protrudes from the gate electrode layer 330 in a direction being parallel to the gate line 510. By providing the structure illustrated in FIG. 5D, the aspect ratio L/W may be enhanced in larger resistance values due to the enhanced aspect ratio L/W may be achieved. Setting a sheet resistance of the gate electrode layer 330 and the gate interconnecting element 325 of 10 Ohm/square, and an aspect ratio L/W of more than 4 may allow for resistance values of more than 40 Ohm. Thus, by arranging the gate interconnecting element 325 in a direction parallel to the first direction x, or parallel to the gate line 510, the aspect ratio L/W of the gate interconnecting element 325 may be greater than 2, or may be greater than 3, or may be greater than 4, or may be greater than 5, or may be greater than 6, or may be greater than 7, or may be greater than 8, or may be greater than 9, or may be greater than 10. By tuning the length L and the width W of the gate interconnecting element 325, the resistance value can be adjusted in a flexible way.

Referring to FIGS. 5C and 5D, an edge portion of the gate interconnecting structure 320 and an edge portion of the gate electrode layer 330 may be arranged along a same line parallel to the gate line 510. The edge portion of the gate interconnecting structure 320 and the edge portion of the gate electrode layer 330 may be thus arranged along a same line in parallel along the first lateral direction x, along which the gate line 510 extends at the respective portion. The edge portion of the gate interconnecting structure 320 and the edge portion of the gate electrode layer 330 may be located in an overlapping region between the gate line 510 and the semiconductor body 100. The edge portion of the gate interconnecting structure 320 and the edge portion of the gate electrode layer 330 may be part of the edge termination area 900.

Figure 7:
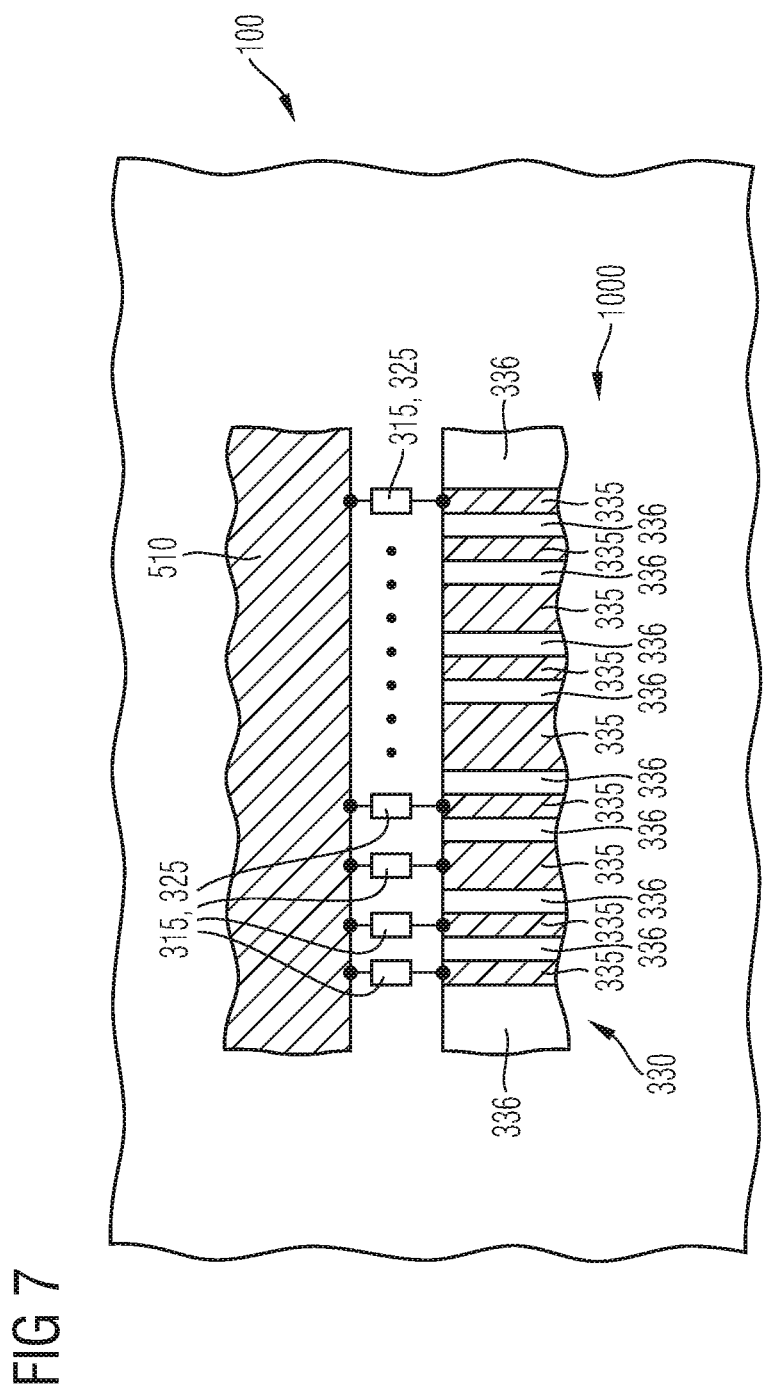
FIG. 7 is a schematic plan view for illustrating a portion of a semiconductor device in accordance with one more embodiment.

As mentioned above, the embodiments illustrated in FIGS. 5A to 5D may be provided at portions A, B, or C of the metal wiring structure illustrated in FIG. 4. Since the resistance value of a gate resistor element 315 or a gate interconnecting element 325 can be locally adjusted by tuning the length L and the width W of the respective element, different resistance values of the gate resistor element 315 or the gate interconnecting element 325 may be provided at portions A, B, or C of FIG. 4. This tuning of the resistance values of the gate resistor elements 315 or the gate interconnecting elements 325 provides the benefit of compensating the resistance of the electrical pathway of the gate line 510 from the gate pad 520 to connection nodes of respective gate resistor elements 315 or to connection nodes of gate interconnecting elements 325 to the gate electrode layer 330. This enables definition of switching delay durations of different transistor cell zones 335. Therefore, the gate electrode layer 330 of these transistor zones of the transistor cell structure 1000 may be electrically isolated by isolation zones 336. An exemplary embodiment of a semiconductor device 10 having a gate electrode layer 330 divided into different transistor cell zones 335 is shown in FIG. 7. Portions A, B, or C of FIG. 4 may represent a connection node comprising a gate resistor element 315 or a gate interconnecting element 325, being indicated as a resistor in FIG. 7.

According to the embodiment of FIG. 7, a silicided polycrystalline silicon gate structure is provided with a low square resistance. In case of large width of the different gate polycrystalline silicon lines, standard non-silicided lines are also possible. According to FIG. 7, the transistor cell zones 335 may have a stripe topology. This enables switching dedicated transistor cell zones 335 of the semiconductor device 10 with different rise and fall times as compared to other transistor cell zones 335. One requirement for efficient switching is that the resistance of each line is much smaller than the resistance of the gate resistor element 315 or the gate interconnecting element 325.

In order to compensate the different pathway resistances of the gate line 510 from the gate pad 520 to the respective gate resistor elements 315, an electrical resistance of the gate resistor elements 315 may decrease with increasing electrical resistance of the gate line 510 from the gate pad 520 to the gate resistor elements 315, respectively. In a same way, an electrical resistance of the gate interconnecting elements 325 may decrease with increasing electrical resistance of the gate line 510 from the gate pad 520 to the gate interconnecting elements 325, respectively.

A difference between electrical resistance values of two neighbouring gate resistor elements 315 or two neighbouring gate interconnecting elements 325 may be equal to the resistance value of a part of the gate line 510 interconnecting the two neighbouring gate resistor elements 315 or the two neighbouring gate interconnecting elements 325. This electric resistance value difference may also deviate from the resistance value of a part of the gate line 510 interconnecting the two neighbouring gate resistor elements 315 or the two neighbouring gate interconnecting elements 325 by 5 Ohm, or by 3 Ohm, or by 1 Ohm, or by 0.5 Ohm or by 0.1 Ohm, for example.

Thus, the longer the electrical pathway from the gate pad 520 to a respective gate resistor element 315 or gate interconnecting element 325 is, the smaller is the resistance value of a respective gate resistor element 315 or gate interconnecting element 325. Due to the compensation of the electrical resistance of the gate line 510 by the gate interconnecting elements 325 or gate resistor elements 315, the total resistance values from the gate pad 520 to respective nodes of the gate electrode layer 330 being electrically coupled to respective gate resistor elements 315 or to gate interconnecting elements 325 are equal to each other or differ in a resistance value of at most 5 Ohm, or at most 3 Ohm, or at most 1 Ohm, or at most 0.5 Ohm.

FIGS. 8A and 8B are schematic flow diagrams for illustrating a method 2000 and a method 3000 of manufacturing a semiconductor device, respectively.

It will be appreciated that while method 2000 or method 3000 are illustrated and described below as a series of acts or events, the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects of embodiments of the disclosure herein. Also, one or more of the acts depicted herein may be carried out in one or more separate act and/or phases.

A schematic flow diagram for illustrating a method 2000 of manufacturing a semiconductor device is depicted in FIG. 8A.

Process features S100 comprises forming a transistor cell structure in a semiconductor body having a first surface and a second surface opposite to the first surface.

Process feature S110 comprises forming a gate contact structure comprising a gate line electrically coupled to a gate electrode layer of the transistor cell structure, and a gate pad electrically coupled to the gate line.

Process feature S120 comprises forming a gate resistor structure electrically coupled between the gate pad and the gate electrode layer, wherein an electric resistivity of the gate resistor structure is greater than the electric resistivity of the gate electrode layer.

A schematic flow diagram for illustrating a method 3000 of manufacturing a semiconductor device is depicted in FIG. 8B.

Process feature S200 comprises forming a transistor cell structure in the semiconductor body having a first surface and a second surface opposite to the first surface.

Process feature S210 comprises forming a gate contact structure comprising a gate line electrically coupled to a gate electrode layer of the transistor cell structure, and a gate pad electrically coupled to the gate line.

Process feature S220 comprises forming a gate interconnecting structure comprising gate interconnecting elements protruding from the gate electrode layer and electrically coupled in parallel to the gate line, wherein the minimum resistance of the gate interconnecting elements is greater than 40 Ohm.

According to the embodiments described above, a shared gate polycrystalline silicon resistor network may be used. The shared resistor network of gate resistor elements 315 or gate interconnecting elements 325 may be portioned around a high voltage edge termination region of a power transistor or IGBT. These portioned resistors may be defined very precisely to have a better control of the integrated gate resistor network. The shared gate resistor structure 310 or gate interconnecting structure 320 may be built by using a gate polycrystalline silicon or a polycrystalline silicon layer for electrostatic discharge protection devices which is integrated within a high voltage edge termination region. For very large chip areas a more homogeneous signal behaviour is achieved as compared to large chip layouts with gate fingers.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A semiconductor device, comprising:
   a semiconductor body having a first surface and a second surface opposite to the first surface;
   a transistor cell structure in the semiconductor body;
   a gate contact structure comprising a gate line electrically coupled to a gate electrode layer of the transistor cell structure, and a gate pad electrically coupled to the gate line to form an electrical pathway between the gate pad and the gate electrode layer; and
   a gate resistor structure separate from the gate contact structure, integrated in the electrical pathway between the gate pad and the gate electrode layer, and formed on a different isolation layer than the gate contact structure,
   wherein an electric resistivity of the gate resistor structure is greater than the electric resistivity of the gate electrode layer.

2. The semiconductor device of claim 1, further comprising a source contact structure overlapping the transistor cell structure, the source contact structure being electrically connected to source regions of the transistor cell structure.

3. The semiconductor device of claim 2, wherein the gate line at least partly surrounds the source contact structure.

4. The semiconductor device of claim 1, wherein the gate resistor structure is electrically coupled between the gate pad and the gate line.

5. The semiconductor device of claim 1, wherein the gate resistor structure is electrically coupled between the gate line and the gate electrode layer.

6. The semiconductor device of claim 1, wherein an edge portion of the gate resistor structure and an edge portion of the gate electrode layer are arranged along a same line parallel to the gate line.

7. The semiconductor device of claim 1, wherein the gate resistor structure comprises a polycrystalline silicon layer having a sheet resistance higher than 10 Ohm/square.

8. The semiconductor device of claim 1, wherein the source contact structure and the gate contact structure are patterned parts of a same metal wiring layer.

9. The semiconductor device of claim 1, further comprising a first isolation layer on the first surface of the semiconductor body, wherein the gate resistor structure and the gate electrode layer are formed on the first isolation layer.

10. The semiconductor device of claim 9, further comprising a second isolation layer on the gate resistor structure and the gate electrode layer, wherein the gate contact structure is formed on the second isolation layer.

11. The semiconductor device of claim 1, wherein the gate resistor structure comprises gate resistor elements electrically coupled in parallel between the gate line and the gate electrode layer of the transistor cell structure.

12. The semiconductor device of claim 11, wherein an electrical resistance of the gate resistor elements decreases with an increasing electrical resistance of the gate line from the gate pad to the gate resistor elements, respectively.

13. The semiconductor device of claim 11, wherein a first terminal of the gate resistor structure is electrically connected with the gate line by a first electric contact structure and a second terminal of the gate resistor structure is electrically connected with the gate electrode layer by a second electric contact structure.

14. The semiconductor device of claim 13, wherein the second electric contact structure comprises two electric contact elements, which are electrically shunted by a bridging element.

15. The semiconductor device of claim 13, wherein at least a part of the second electric contact structure is located within a lateral recess of the gate line.

16. A semiconductor device, comprising:
a semiconductor body having a first surface and a second surface opposite to the first surface;
a transistor cell structure in the semiconductor body;
a gate contact structure comprising a gate line electrically coupled to a gate electrode layer of the transistor cell structure, and a gate pad electrically coupled to the gate line to form an electrical pathway between the gate pad and the gate electrode layer; and
a gate interconnecting structure separate from the gate contact structure and comprising gate interconnecting elements protruding from the gate electrode layer and being electrically coupled in parallel to the gate line,
wherein the gate interconnecting structure is formed on a different isolation layer than the gate contact structure,
wherein a minimum resistance of the gate interconnecting elements is greater than 40 Ohm.

17. The semiconductor device of claim 16, wherein the gate interconnecting elements are formed as comb segments protruding from the gate electrode layer in a lateral plane.

18. The semiconductor device of claim 16, wherein an electrical resistance of the gate interconnecting elements decreases with an increasing electrical resistance of the gate line from the gate pad to the gate interconnecting elements, respectively.

19. A method for manufacturing a semiconductor device, the method comprising:
forming a transistor cell structure in a semiconductor body having a first surface and a second surface opposite to the first surface;
forming a gate contact structure comprising a gate line electrically coupled to a gate electrode layer of the transistor cell structure, and a gate pad electrically coupled to the gate line to form an electrical pathway between the gate pad and the gate electrode layer; and
forming a gate resistor structure separate from the gate contact structure, integrated in the electrical pathway between the gate pad and the gate electrode layer, and formed on a different isolation layer than the gate contact structure,
wherein an electric resistivity of the gate resistor structure is greater than the electric resistivity of the gate electrode layer.

20. A method for manufacturing a semiconductor device, the method comprising:
forming a transistor cell structure in a semiconductor body having a first surface and a second surface opposite to the first surface;
forming a gate contact structure comprising a gate line electrically coupled to a gate electrode layer of the transistor cell structure, and a gate pad electrically coupled to the gate line to form an electrical pathway between the gate pad and the gate electrode layer; and
forming a gate interconnecting structure separate from the gate contact structure and comprising gate interconnecting elements protruding from the gate electrode layer and electrically coupled in parallel to the gate line, the gate interconnecting structure being formed on a different isolation layer than the gate contact structure,
wherein a minimum resistance of the gate interconnecting elements is greater than 40 Ohm.

* * * * *